US006767658B2

(12) United States Patent
Yamamoto et al.

(10) Patent No.: US 6,767,658 B2
(45) Date of Patent: Jul. 27, 2004

(54) HARD WEAR RESISTANT FILM, PROCESS FOR FORMING HARD FILM, AND TARGET USED TO FORM HARD FILM

(75) Inventors: Kenji Yamamoto, Kobe (JP); Toshiki Sato, Kobe (JP)

(73) Assignee: Kobe Steel, Ltd., Kobe (JP)

( * ) Notice: Subject to any disclaimer, the term of this patent is extended or adjusted under 35 U.S.C. 154(b) by 25 days.

(21) Appl. No.: 10/200,535

(22) Filed: Jul. 23, 2002

(65) Prior Publication Data

US 2003/0148145 A1 Aug. 7, 2003

(30) Foreign Application Priority Data

Jul. 23, 2001 (JP) ....................................... 2001-221772
Jul. 23, 2001 (JP) ....................................... 2001-221773

(51) Int. Cl.[7] ................................................ C23C 14/06

(52) U.S. Cl. ........................... 428/698; 51/307; 51/309; 427/523; 427/530; 428/697; 428/698

(58) Field of Search ................................ 428/697, 698, 428/699; 51/307, 309; 427/523, 530

(56) References Cited

U.S. PATENT DOCUMENTS 4,556,607 A * 12/1985 Sastri
4,842,710 A * 6/1989 Freller et al.
5,981,049 A * 11/1999 Ohara et al.
6,110,571 A * 8/2000 Yaginuma et al.
6,296,928 B1 * 10/2001 Yamada et al.
6,492,011 B1 * 12/2002 Brandle et al.
6,586,122 B2 * 7/2003 Ishikawa et al.

FOREIGN PATENT DOCUMENTS

WO 03/000618 * 1/2003

* cited by examiner

*Primary Examiner*—Archene Turner
(74) *Attorney, Agent, or Firm*—Oblon, Spivak, McClelland, Maier & Neustadt, P.C.

(57) ABSTRACT

Disclosed is a hard film exhibiting high wear resistance, with composition of $(Al_b,[Cr_{1-\alpha}V_\alpha]_c(C_{1-d}N_d)$, satisfying the condition of $0.5 \leqq b \leqq 0.8$, $0.2 \leqq c \leqq 0.5$, $b+c=1$, $0.05 \leqq \alpha \leqq 0.95$, $0.5 \leqq d \leqq 1$ (where b and c each represents atomic ratio of Al and Cr+V, and d denotes atomic ratio of N, $\alpha$ denotes atomic ratio of V.), or with composition of $(M_\alpha,Al_b,[Cr_{-\alpha}V_\alpha]_c)(C_{1-d}N_d)$, wherein M is at least one element selected from Ti, Nb, W, Ta and Mo and satisfying the condition of $0.02 \leqq a \leqq 0.3$, $0.5 \leqq b \leqq 0.8$, $0.05 \leqq c$, $a+b+c=1$, $0.5 \leqq d \leqq 1$, $0 \leqq \alpha \leqq 1$ (where a represents atomic ratio of M). However, the case is exempted where M is Ti and the value of $\alpha$ is 0.

23 Claims, 8 Drawing Sheets

Ra = 0. 08μm

Ra = 0. 16μm (1) FILM FORMED BY EVAPORATING SOURCE OF THE PRESENT INVENTION (2) FILM FORMED BY CONVENTIONAL TYPE EVAPORATION SOURCE

HARD WEAR RESISTANT FILM, PROCESS FOR FORMING HARD FILM, AND TARGET USED TO FORM HARD FILM

BACKGROUND OF THE INVENTION

1. Field of the Invention

The present invention relates to an improvement of a hard film for wear resistant applications such as plastic working tools (e.g., punching and forming dies) and cutting tools (e.g., tips, drills and end mills), a process for forming said hard film, and a target used as an evaporating source to form said hard film.

2. Description of the Related Art

In the past, for the purpose of improving wear resistance of cutting tools using cemented carbide, cermet or high-speed tool steel as base material, it has been practiced to perform coating of hard film such as TiN, TiCN, TiAlN, etc. In particular, compound nitride film of Ti and Al (hereinafter referred as "TiAlN") exhibits excellent wear resistance, and it is applied on cutting tools for high-speed cutting operation or for cutting the material with high hardness such as hardened steel instead of the film, which comprises nitride, carbide or carbide-nitride of titanium. Further, more recently, in addition to two-element material such as TiAlN, attempts have been made to improve the characteristics by adding a third element. For instance, in the Japanese Patent Publications Laid-Open 3-120354, 10-18024, 10-237628, and 10-305935, it is disclosed that TiAlVN or (TiAlV)(CN) film added with V exhibits superb cutting characteristics in the cutting operation of the material with low hardness such as S50C. However, it is difficult to say that these films have good cutting characteristics to the materials with high hardness such as hardened steels. To cope with the increasing trend directed toward high cutting speed, there are now strong demands to have the film with higher wear resistant property.

To solve the above problems, it is an object of the present invention to provide a hard film for wear resistant applications such as cutting tools, which is suitable for cutting at high speed and with higher efficiency and which has higher hardness and better wear resistance than TiAlN or (TiAlV)(CN) used in the past. The object of the invention is also to provide a method for forming such hard film, and further to provide a target for efficiently forming the hard film for wear resistant applications such as cutting tools of the present invention.

SUMMARY OF THE INVENTION

To attain the above object, the present invention provides a hard wear resistant film composed of $(Al_b,[Cr_{1-\alpha}V_\alpha]_c)(C_{1-d}N_d)$, and the composition of the components satisfies the conditions:

$0.5 \leqq b \leqq 0.8$, $0.2 \leqq c \leqq 0.5$, $b+c=1$, $0.05 \leqq \alpha \leqq 0.95$, $0.5 \leqq d \leqq 1$ (where b and c each represents atomic ratio of Al and Cr+V, d denotes atomic ratio of N, and α represents atomic ratio of V). (Hereinafter, this film may called "the first film".)

Further, the present invention provides a hard wear resistant film composed of $(M_a,Al_b,[Cr_{1-\alpha}V_\alpha]_c)(C_{1-d}N_d)$, where M is at least one element selected from Ti, Nb, W, Ta and Mo, and said hard film satisfying the conditions:

$0.02 \leqq a \leqq 0.3$, $0.5 \leqq b \leqq 0.8$, $0.05 \leqq c$, $a+b+c=1$, $0.5 \leqq d \leqq 1$, $0 \leqq \alpha \leqq 1$ (where a, b and c each represents atomic ratio of M, Al, and Cr+V, d denotes atomic ratio of N, and α represents atomic ratio of V). For the case where M is Ti and the value of α is 0 in the preferred aspect of the invention, it has been already applied as the Japanese Patent Application 2001-185464 (not yet laid-open), and this is exempted from the present invention. (Hereinafter, this film may be called the second hard film.) Further, when the value of α is 1, it is preferable that the values of b and c satisfy the conditions:

$0.5 \leqq b \leqq 0.8$, $0.05 \leqq c$, $0.7 \leqq b+c$.

Also, in the hard wear resistant film according to a preferred aspect of the present invention, the value of d is 1, and crystal structure has rock salt structure as main structure. Also, it is preferable that, when diffraction line intensities of (111) plane, (200) plane and (220) plane of rock salt structure measured by X-ray diffraction based on θ−2θ method are set to I(111), I(200) and I(220) respectively, these values satisfy the expressions (1) and/or (2) and the expression 3 given below:

$$I(220) \leqq I(111) \quad (1)$$

$$I(220) \leqq I(200) \quad (2)$$

$$I(200)/I(111) \geqq 0.3 \quad (3)$$

The hard wear resistant film of the present invention include: a hard film satisfying the above requirements and two layers or more of hard films different from each other and laminated on each other; or one layer or two layers or more of the hard films of the present invention have crystal structure with rock salt structure as main structure and are attached on one surface or both surfaces of the hard film, and one layer or more of metal layers or alloy layers containing at least one element selected from 4A Group, 5A Group, 6A Group, Al and Si are laminated; at least one layer selected from metal nitride layer, metal carbide layer and metal carbide-nitride layer having different composition as that of the hard film as described above are laminated.

The present invention also defines a method for forming the hard wear resistant film as described above. It is a method for forming the film defined in the present invention on an object to be processed by evaporating and ionizing metal in an atmosphere of film-forming gas and for forming the film while promoting conversion of the film-forming gas together with the metal into plasma. The present invention also provides the hard film using arc ion plating method (AIP method) by evaporating and ionizing the metals, which constitute the target, by arc discharge, and forming the film defined in the present invention on an object to be processed, whereby a line of magnetic force is formed, which runs almost in parallel to the normal to the evaporating surface of the target and running in parallel to or slightly divergent from the normal to the evaporating surface of the target, and the film is formed by promoting conversion of the film-forming gas near the object to be processed to plasma. In this case, it is preferable that bias potential applied on the object to be processed is set to the range of −50 V to −300 V with respect to the earth potential. Also, it is desirable that the temperature of the object to be processed (may be referred as substrate temperature hereinafter) during film-forming operation is set to the range of 300° C. to 800° C. It is also preferable that partial pressure or total pressure of the reactive gas during film-forming operation is set to the range of 0.5 Pa to 6 Pa.

The reactive gas in the present invention is a gas such as nitrogen gas, methane gas, ethylene gas, acetylene gas, etc. and contains elements required for the compositions of the film. Other types of gas, i.e. rare gas such as argon gas, is called "assist gas". These are called together as "film-forming gas".

Further, the present invention also includes a target for forming a hard film, which comprises Al, Cr and V, or M (where M is at least one element selected from Ti, Nb, W, Ta and Mo), Al, Cr, and/or V, and which has relative density of 95% or more. It is preferable that size of each of the voids present in the target is not smaller than 0.3 mm in radius.

For forming the hard film (the first hard film) of the present invention expressed by $(Al_b,[Cr_{1-\alpha}V\alpha]_c)(C_{1-d}N_d)$ it is preferable to use a target, which comprises $(Al_y,[Cr_{1-\beta}V_\beta]_z)$ and satisfying the conditions:

$0.5 \leqq y \leqq 0.8$, $0.2 \leqq z \leqq 0.5$, $y+z=1$, $0.05 \leqq \beta \leqq 0.95$ (where y and z each represents atomic ratio of A and Cr+V, and β denotes atomic ratio of V).

Also, for forming the hard film (the second hard film) of the present invention expressed by $(M_a,Al_b,[Cr_{1-\alpha}V_\alpha]_c)(C_{1-d}N_d)$, it is preferable to use a target, which comprises $(M_x,Al_y,[Cr_{1-\beta}V_\beta]_z)$, where M is at least one element selected from Ti, Nb, W, Ta and Mo and satisfying the conditions:

$0.02 \leqq x \leqq 0.3$, $0.5 \leqq y \leqq 0.8$, $0.05 \leqq z$, $x+y+z=1$, $0 \leqq \beta \leqq 1$ (where x, y and z each represents atomic ratio of M, Al, and Cr+V, and β denotes atomic ratio of V). For forming the hard film of the preferred aspect of the present invention where M is Ti, it is preferable to use a target, in which M is Ti. However, in the hard film of the present invention, the case where M is Ti and the value of α is 0 is exempted. Therefore, for the target also, the case where M is Ti and the value of β is 0 is exempted.

Further, for forming the hard film, in which M is Ti and the value of α is 1 and the value of atomic ratio (b+c) of Al+V is 0.7 or more, the value of b is within the range of 0.5 to 0.8, and the value of c is more than 0.05, it is preferable to use a target, in which the value of y and z is $0.5<y \leqq 0.8$, $0.05<z$, $0.7 \leqq y+z$, and $\beta=1$.

In the target as described above, it is preferable that oxygen content in the target is 0.3 mass % or less, hydrogen content is 0.05 mass % or less, and chlorine content is 0.2 mass % or less. Further, it is preferable that Cu content is 0.05 mass % or less, and Mg content is 0.03 mass % or less.

Other and further objects, features and advantages of the invention will appear more fully from the following description.

BRIEF DESCRIPTION OF THE DRAWINGS

FIG. 5(1) shows an evaporating source according to the present inventors, and FIG. 5(2) shows the result of film formation using a conventional type evaporating source;

DETAILED DESCRIPTION OF THE PREFERRED EMBODIMENTS

Figure 1:
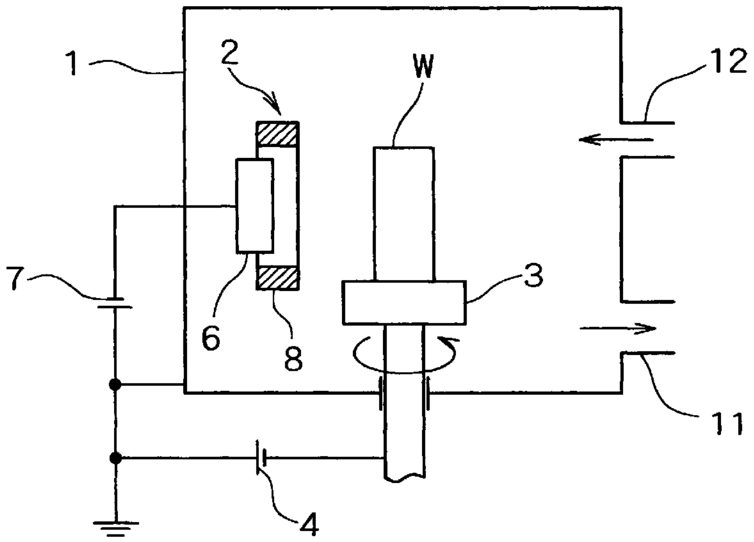
FIG. 1 is a schematical drawing to show an example of an arc ion plating (AIP) apparatus used for carrying out the present invention.

Under the circumstances as described above, the present inventors have conducted extensive studies to obtain a hard film, which exhibits better wear resistance than before. As a result, it has been found that wear resistance can be extensively improved by increasing the hardness of the film as an index.

The present inventors have carried out extensive studies by taking special notice of Al concentration in (TiAl)(CN) film and of the influence by other additive elements. As a result, it has been found that film hardness can be improved and higher wear resistance can be achieved by increasing Al concentration, by adding Cr or V, and further, by adding at least one element selected from Ti, Nb, W, Ta and Mo. Further, efforts have been made to study on quantitative operative effects of Al, element M, Cr and V, and the present inventors have conceived the present invention.

Specifically, the hard film of the present invention is a hard film composed of $(Al_b,[Cr_{1-\alpha}V_\alpha]_c)(C_{1-d}N_d)$, and the composition of the components satisfy the conditions:

$0.5 \leqq b \leqq 0.8$, $0.2 \leqq c \leqq 0.5$, $b+c=1$, $0.05 \leqq \alpha \leqq 0.95$, $0.5 \leqq d \leqq 1$ (where b and c each represents atomic ratio of Al and Cr+V, d denotes atomic ratio of N, and a represents atomic ratio of V).

Or, it is a hard film composed of $(M_a,Al_b,[Cr_{1-\alpha}V_\alpha]_c)(C_{1-d}N_d)$, where M is at least one element selected from Ti, Nb, W, Ta and Mo, and satisfying the conditions:

$0.02 \leqq a \leqq 0.3$, $0.5 \leqq = b \leqq 0.8$, $0.05 \leq c$,
$a+b+c=1$,
$0.5 \leq d \leq 1$,
$0 \leq \alpha \leq 1$ (where a, b and c each represents atomic ratio of M, Al, and Cr+V, d denotes atomic ratio of N, and α represents atomic ratio of V). Detailed description will be given below on the reasons why the composition of M, Al, Cr, V, C and N in the film is determined as described above.

The TiAlN film as described above is a crystal of rock salt structure, and it is a compound nitride of rock salt structure, in which the Ti site of TiN in rock salt structure is replaced by Al. Incidentally, AlN (lattice constant: 4.12 Å) of rock salt structure is in equilibrium state at high temperature and under high pressure, and this suggests that it is a substance having high hardness. Therefore, it would be possible to increase the hardness of TiAlN film if the ratio of Al in TiAlN is increased while maintaining the rock salt structure. However, AlN of rock salt structure is in quasi-stable state at normal temperature and under normal pressure or at high temperature and under normal pressure. Consequently, even when ordinary vapor phase coating may be performed, it merely leads to the formation of AlN of ZnS structure (which is soft), and it is not possible to form AlN of rock salt structure. Incidentally, it is possible to form a TiAlN film of rock salt structure at normal temperature and under normal pressure if nitride film is formed by incorporation of Al into Ti because TiN is of rock salt structure and has a lattice constant closer to that of AlN of rock salt structure, and hence, AlN is assimilated into the structure of TiN. However, as mentioned above, if the amount of Al in TiAlN exceeds a certain limit which is defined by the atomic ratio of 0.6–0.7, soft AlN of ZnS structure is deposited, and the hardness is decreased. As a result, TiAlN film of rock salt structure or (TiAl)(CN) film can be formed. However, in the patent publication given above, it is disclosed that, when the ratio of Al in TiAlN exceeds the limit of 0.6–0.7 in atomic ratio, soft AlN of ZnS structure is deposited, and the hardness is decreased. This may be attributed to the fact that, when Al concentration is increased, the effect of assimilation by TiN of rock salt structure is weakened, and the formation of soft AlN of ZnS structure becomes predominant. on the other hand, CrN or VN has a lattice constant closer to that of AlN of rock salt structure than TiN (AlN: 4.12 Å; TiN: 4.24 Å; CrN and VN: 4.14 Å). By substituting Ti in TiAlN by Cr and V, it would be possible to maintain the rock salt structure at higher Al concentration.

In this respect, in the present invention, efforts have been made to obtain component composition as follows: (Al,Cr,V)(CN) film added with Cr and V instead of Ti is used as a first hard film. By providing the assimilation effect as described above to the utmost extent, AlN of rock salt structure is deposited, and attempt is made to form a film having rock salt structure as main structure even at high Al concentration.

As a result, in order that the assimilation effect as described above can be provided more effectively, the atomic ratio "c" of Cr+V must be 0.2 or more and 0.5 or less. Further, in order that the amount of Al is increased and the ratio of AlN of rock salt structure is increased, it is preferable that the upper limit of the atomic ratio "c" of Cr+V is 0.4, or more preferably 0.3. If the amount of (Cr+V) is decreased, the assimilation effect by (CrN+VN), which has a lattice constant closer to that of AlN of rock salt structure, is decreased. Therefore, it is preferable that the lower limit of the atomic ratio "c" of Cr+V is set to 0.23.

Regarding the atomic ratio α of V in (Cr+V), the lower limit of α is set to 0.05 and the upper limit is set to 0.95. The lower limit of α is preferably 0.2, or more preferably 0.3. The upper limit of α is preferably 0.8, or more preferably 0.7. The reasons are as follows: Each of CrN and VN has a lattice constant almost equal to each other. If Cr is added, wear resistance to the workpiece (the material to be cut) of iron type can be increased. If V is added, lubricating effect can be obtained under dry cutting condition. Therefore, the ratio of Cr and V may be adjusted depending on each application. As the cutting tools, it is desirable that these two types of characteristics are provided.

The atomic ratio of Al is determined by the value of the atomic ratio "c" of (Cr+V) as given above. If the ratio of Al is too low, the amount of deposited AlN of rock salt structure is low, and the effect of high hardness cannot be obtained. Thus, the lower limit of the atomic ratio "b" of Al is set to 0.5. The lower limit of the value "b" is preferably 0.55, or more preferably 0.6, or most preferably 0.65. On the other hand, the upper limit of the atomic ratio of Al is set to 0.8. This is because if the ratio of Al is too high, adding amounts of Cr and V are relatively decreased. This results in weaker assimilation effect. As a result, the film may be turned to softer due to the deposition of soft AlN of ZnS structure. The upper limit of the atomic ratio "b" of Al is preferably 0.77, or more preferably 0.75.

Further, as the second hard film of the present invention, the elements forming the nitrides having lattice constants different from that of CrN and VN (lattice constant: 4.14 Å) are substituted by Cr and V. (These elements are: M, Ti (lattice constant of TiN: 4.24 Å), Nb (lattice constant of NbN: 4.39 Å), W (lattice constant of $W_2N$: 4.12 Å), Ta (lattice constant of TaN: 4.33 Å), and Mo (lattice constant of $MO_2N$: 4.16 Å).) As a result, in addition to the hardness increased due to higher Al concentration, the hardness of the film is further increased by the effect of lattice distortion.

As described above, in (M,Al,Cr,V)(CN) film, at least one element selected from Ti, Nb, W, Ta and Mo is added as the element M, which forms nitride having lattice constant different from that of CrN and VN. By the difference from the lattice constant of CrN and VN, crystal lattice is distorted and hardness is increased. For this purpose, it has been found that the lower limit of the atomic ratio "a" of M is preferably set to 0.02, or more preferably to 0.05 or more, or most preferably to 0.1 or more.

On the other hand, if the atomic ratio "a" of M is too high, adding amounts of Cr and V are restricted, and this leads to weaker assimilation effect. Even when Al content is the same, in a film containing high ratio of M, AlN of ZnS structure is deposited, and the film becomes softer. Therefore, the upper limit of the atomic ratio "a" of M is set to 0.3. The upper limit of the atomic ratio "a" of M, is preferably 0.25, or more preferably 0.2.

In particular, when Ti, Nb or Ta is added as the element M, it is preferable because the nitrides of these elements have higher lattice constant than that of CrN or VN, and higher hardness can be effectively attained by lattice distortion. Most preferably, Ti is used alone as the element M. Besides to the addition of Ti, Nb or Ta alone, it is also effective to combine two elements such as Ti and Nb, or Ti and Ta, or Ta and Nb, or Nb and Ta, and further, to add three elements of Ti, Ta, and Nb in combination. When two elements or more are added at the same time, there is no special restriction on the ratio between these elements. However, it is preferable that the element with the least adding amount is contained at the atomic ratio of 0.05a or more (where a is the atomic ratio of the element M), or more preferably 0.1a or more.

Regarding Cr and V, these are the elements necessary for forming AlN of rock salt structure in the film by assimilation effect, and the lower limit of the atomic ratio "c" of (Cr+V) in the (M,Al,Cr,V)(CN) film preferably is set to 0.05. More preferably, it is 0.1 or more, or most preferably 0.15 or more. When the amount of (Cr+V) is decreased, the assimilation effect by (CrN+VN) having lattice constant closer to that of AlN of rock salt structure is decreased. Thus, it is preferable to set the lower limit of the atomic ratio "c" of Cr+V to 0.23.

Regarding the atomic ratio a of V in (Cr+V), each of CrN and VN has a lattice constant almost equal to each other. Cr exhibits high wear resistance to the workpiece (the material to be cut) of iron type, and V has specific effect such as lubricating effect under dry cutting condition. Therefore, these may be selected for use in each application, and there is no special restriction. From the viewpoint of maintaining these two characteristics, it is preferable to set the lower limit of $\alpha$ to 0.2, or more preferably to 0.3.

The lower limit of the atomic ratio "b" of Al is set to 0.5. This is because, if the ratio of Al is too low, the amount of the deposited AlN of rock salt structure is low, and this results in lower hardness. The lower limit of the atomic ratio "b" is preferably 0.55, or more preferably 0.6, or most preferably 0.65. On the other hand, the upper limit of the atomic ratio of Al is set to 0.8. This is because, if the ratio of Al is too high, the adding amounts of Cr and V are relatively decreased. This leads to weaker assimilation effect. As a result, the film is turned to softer due to deposition of soft AlN of ZnS structure. The upper limit of the atomic ratio "b" of Al is preferably 0.77, or more preferably 0.75.

In (Ti,Al,V)(C,N) film, in which M is Ti and $\alpha$ is 1, the highest lubricating effect can be attained during cutting operation of iron type alloy and wearing is decreased. Therefore, it is preferable to use this as a film for cutting of iron type alloy. In this case, TiN with lattice constant different from VN is replaced by V, and it is possible to increase the hardness of the film by the effect of lattice distortion. In order to obtain such effect, it is preferable that the atomic ratio of Al is set to more than 0.5, the atomic ratio of V is set to more than 0.05, and that the total of the atomic ratios (b+c) of (Al+V) is set to 0.7 or more. The total atomic ratio (b+c) is preferably 0.75 or more, or most preferably 0.8 or more. Regarding the amount of Ti, in case the total atomic ratio (b+c) is 0.75 or more, it is preferably 0.25 or less, or more preferably 0.2 or less.

In the first and the second hard films as described above, the amounts of C and N were determined from the following reasons: When C is added to the film and Ti, Nb and Ta are added as VC or M, and when carbide with high hardness such as TiC, NbC, TaC, etc. are deposited to increase the hardness of the film, it is desirable that the amount of C is about the same as the adding amount (atomic ratio) of V in the first hard film, and that it is about the same amount as the adding amount (atomic ratio) of M+V in the second hard film. However, if C is added in excess, it may lead to excessive deposition of aluminum carbide, which is not stable because it reacts with moisture and is easily decomposed. In this respect, the atomic ratio (1−d) of C is preferably set to less than 0.5. That is, the atomic ratio "d" of N is preferably set to 0.5 or more. The value "d" is preferably 0.7 or more, or more preferably 0.8 or more. It is most desirable if d=1.

It is preferable that the crystal structure of the hard film of the present invention substantially contains rock salt structure as main structure. As described above, when ZnS structure is intermingled, it is not possible to maintain high strength. However, it is allowed that some ZnS structures are contained in the structure so far as it does not impair the characteristics of the film. For reference purpose, the desirable range of rock salt structure and ZnS structure measured by X-ray diffraction are given below.

Specifically, the crystal structure mainly containing the rock salt structure is a structure as follows: It is such a crystal structure that the value of the expression (4) given below is 0.8 or more, when, among the peaks showing rock salt structure in X-ray diffraction based on θ−2θ method, peak intensities of (111) plane, (200) plane and (220) plane are set to IB(111), IB(200), and IB(220) respectively, and from the peaks showing ZnS structure, peak intensities of (100) plane, (102) plane, and (110) plane are set to IH(100), IH(102) and IH(110) respectively. If the value is less than 0.8, the hardness of the film will be lower than the hardness, which is considered as preferable in the present invention.

The peak intensity of ZnS structure is determined by measuring the intensity of the peak appearing near the point where 2θ=32° to 33° for (100) plane, near the point where 2θ=48° to 50° for (102) plane, and near the point where 2θ=57° to 58° for (110) plane using Kα line of Cu on X-ray diffraction apparatus. The crystal of ZnS structure contains AlN as main component. If Ti, V, Cr, Mo, Ta, W, etc. are intermingled, the position of the peak of AlN of ZnS structure actually measured is slightly deviated from the position of the peak of AlN of ZnS structure on JCPDS cards.

$$\frac{IB(111)+IB(200)+IB(220)}{IB(111)+1B(200)+IB(200)+IH(100)+IH(102)+IH(110)} \tag{4}$$

When the crystal structure of the film of the present invention is measured by X-ray diffraction, it is desirable that diffraction line intensity in the crystal structure of rock salt structure satisfies the conditions: I(220)≦I(111) and/or I(220)≦I(200). This is because if (111) plane or (200) plane, i.e. closely filled plane of rock salt structure, are oriented with respect to the surface, wear resistance is increased.

The ratio of I(200) to I(111), i.e. I(200)/I(111), measured by X-ray diffraction based on θ−2θ method, varies in the range of about 0.1 to 10 depending on the conditions such as bias voltage applied on the substrate during the formation of film, or on gas pressure, film-forming temperature, etc. In the present invention, it has been found that, when the ratio I(200)/I(111) has satisfied the value of 0.3 or more, cutting characteristics of the film was satisfactory. The detailed reason is not known but may be considered as follows: Specifically, in the crystal structure of rock salt structure, metal elements (Al,Cr,V) or (M,Al,Cr,V) are basically bonded with nitrogen or carbon. There is almost no bonding between metal elements themselves, between nitrogen atoms themselves, or between carbon atoms themselves. On (111) plane, the atoms immediately adjacent to each other are the metal elements, nitrogen atoms or carbon atoms, but it is believed that these are not bonded with each other. In contrast, in (200) plane, bonding between the metal elements, between nitrogen atoms and between carbon atoms are found relatively often, and this is regarded as more stable. Therefore, if (200) plane having high intra-plane stability is oriented to the surface at a certain ratio or more with respect to (111) plane, it would be possible to increase the hardness and to improve cutting characteristics. The value of I(200)/I(111) is preferably 0.5 or more, or more preferably 0.7 or more.

Incidentally, diffraction angle of the (111) plane is variable according to the composition of the film, condition of residual stress or type of substrate. When X-ray diffraction based on θ−2θ method is performed using K a line of Cu on the hard film, which meets the requirements of the present invention in case M is Ti, the diffraction angle is changed in the range of 37° to 38°. When the amount of Ti in the film is increased, the diffraction angle tended to be smaller. Thus, the decrease of diffraction angle of (111) plane and the increase of spacing of (111) plane may be attributed to the fact that the lattice constant (4.24 Å) of TiN is higher than the lattice constants of AlN, CrN and VN (AlN: 4.12 Å; CrN and VN: 4.14 Å).

When an example is taken on the case where the hard film $(Ti_{0.1}Al_{0.7}V_{0.2})N$ satisfying the requirements of the present invention is formed on a cemented carbide substrate, the angle of diffraction line of (111) plane is changed in the range of 37.4° to 37.7° depending on the film-forming condition, and half-width of the diffraction line of (111) plane (i.e. width of diffraction line at a point of one-half of the peak maximum intensity) is in the range of 0.2° to 1.5°. Thus, even when the composition of the film is constant, the position of diffraction line is changed, and this is primarily attributed to the stress condition of the film as described later. When the value of compressive stress of the film was increased, diffraction angle showed a tendency to decrease.

As the film of the present invention, in addition to the film of single layer film satisfying the above requirements, a film may be used, which meets the above requirements and comprises two or more layers of different films laminated on each other. Also, depending upon the application, at least one layer selected from metal nitride layer, metal carbide layer and metal carbide-nitride layer having composition different from that of the hard film and having crystal structure of primarily rock salt structure may be laminated on one surface or on both surfaces of one layer or two layers or more of (Al,Cr,V)(CN) film or (M,Al,Cr,V)(CN) film as defined in the present invention.

The "crystal structure primarily of rock salt structure" as described here is defined as a crystal structure having the value of the above expression (4) at 0.8 or more when, among the peaks showing rock salt structure in X-ray diffraction based on θ−2θ method, peak intensities of (111) plane, (200) plane, and (220) plane are set to IB(111), IB(200), and IB(220) respectively, and among the peaks showing ZnS structure, peak intensities of (100) plane, (102) plane, and (110) plane are set to IH(100), IH(102), and IH(110) respectively. The metal nitride layer, the metal carbide layer or metal carbide-nitride layer having composition different from the composition defined in the present invention include, e.g. the films of TiN, TiAlN, TiCrAlN, TiCN, TiAlCN, TiCrAlCN, TiC, etc.

The hard wear resistant film according to the present invention may be such that one or more metal layers or alloy layers containing at least one element selected from 4A Group, 5A Group, 6A Group, Al and Si are laminated on one surface or on both surfaces of one layer or two layers or more of the hard film of the present invention. The metals of 4A Group, 5A Group, and 6A Group may include Cr, Ti, Nb, etc., and Ti—Al or the like may be used as alloy.

When the hard film of the present invention is formed by laminating the following film or layer, the film thickness of one layer may be in the range of 0.005 μm to 2 μm: (i) a film satisfying the requirements of the present invention and different from each other; (ii) metal nitride layer, metal carbide layer or metal carbide-nitride layer having composition different from that of the hard film and being of rock salt structure and (iii) metal layer or alloy layer containing at least one element selected from 4A Group, 5A Group, 6A Group, Al and Si. However, in the hard film of the present invention, it is desirable that, whether it is in single layer or in two layers or more, has a total film thickness is in the range of 0.5 μm to 20 μm. If it is less than 0.5 μm, film thickness is too thin, and satisfactory wear resistance cannot be obtained. On the other hand, if film thickness exceeds 20 μm, the film may be damaged or may be peeled off curing cutting operation. The film thickness is more preferably in the range of 1 μm to 15 μm.

Further, in order to manufacture the hard film of the present invention, which has a crystal structure substantially having rock salt structure as main structure even when the component ratio of Al may be high, and it is very effective to form the film by the method as defined by the present invention. Specifically, a metal to be the target is evaporated and ionized by arc discharge in the film-forming gas atmosphere, and the hard film of the present invention is formed on a material to be processed. It is necessary to promote the conversion of the film-forming gas together with the metal into plasma. In this case, it is preferable that the conversion of the film-forming gas near the material to be processed into plasma is promoted by the line of magnetic force, which runs almost in parallel to the normal to the evaporating surface of the target and running in parallel to or slightly divergent from the normal to the evaporating surface of the target.

The film-forming method of the present invention is not only effective for the formation of (Al,Cr,V)(CN) film or (M,Al,Cr,V)(CN) film having the rock salt structure defined in the present invention as main structure, but also it is a method effective for forming the other types of films.

In the arc ion plating (AIP) apparatus, it is difficult to manufacture the film of the present invention using a cathode evaporating source used in the past where the magnetic field is arranged on rear side of the target. For forming the hard film of the present invention, it is very effective to form a line of magnetic force, which runs almost in parallel to the normal to the evaporating surface of the target and running in parallel to or slightly divergent from the normal to the evaporating surface of the target, and to promote the conversion of nitrogen into plasma by the line of magnetic force.

Now, brief description will be given on an example of an apparatus for carrying out the present invention referring to an AIP apparatus shown in FIG. 1.

This AIP apparatus comprises a vacuum chamber 1 having an exhaust outlet 11 for vacuum exhaust and a gas feeding inlet 12 for supplying atmospheric gas, an arc type evaporating source 2 for evaporating and ionizing a target (serving as a cathode) by arc discharge, a holder 3 for supporting a material to be processed (cutting tool) W, which is to be coated, and a bias power source 4 for applying negative bias voltage on the material to be processed W via the holder 3 between the holder 3 and the vacuum chamber 1.

The arc type evaporating source 2 comprises a target 6 (which serves as a cathode), an arc power source 7 connected between the target 6 and the vacuum chamber 1 (serving as an anode), and a magnet (permanent magnet) 8 running almost in parallel to the normal to the evaporating surface of the target and running in parallel to or slightly divergent from the normal to the evaporating surface of the target, and extending toward the vicinity of the material to be processed W serving as magnetic field forming means for forming a line of magnetic force. It is preferable that magnetic flux density near the material to be processed W is 10 G (Gauss) or more at the center of the material to be processed, or more preferably 30 G or more. The expression "running almost in parallel to the normal" to the evaporating surface means that there is an angle in the range of from 0° to about 30° with respect to the direction of a line perpendicular to the evaporating surface.

Figure 2:
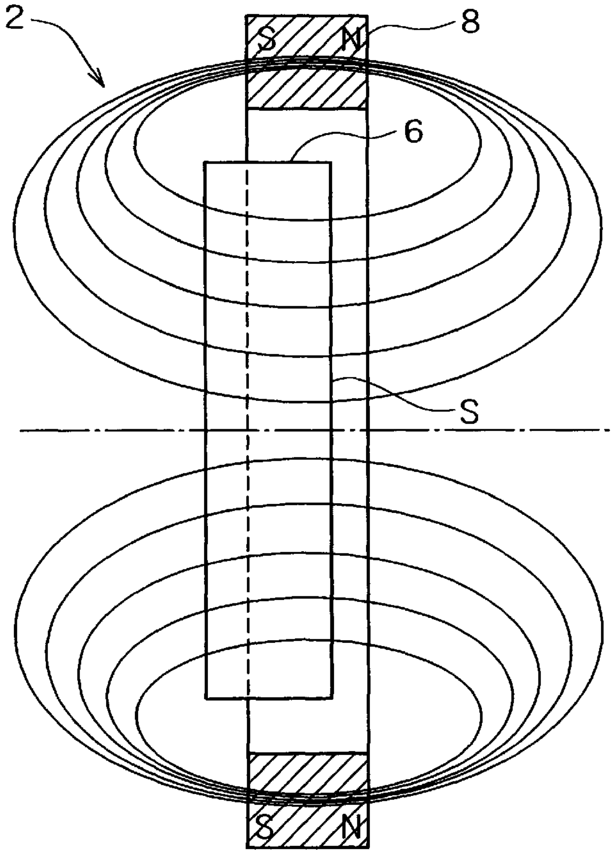
FIG. 2 is a schematical enlarged sectional view of an example of an important part of an arc type evaporating source to be used for carrying out the present invention.
Figure 3:
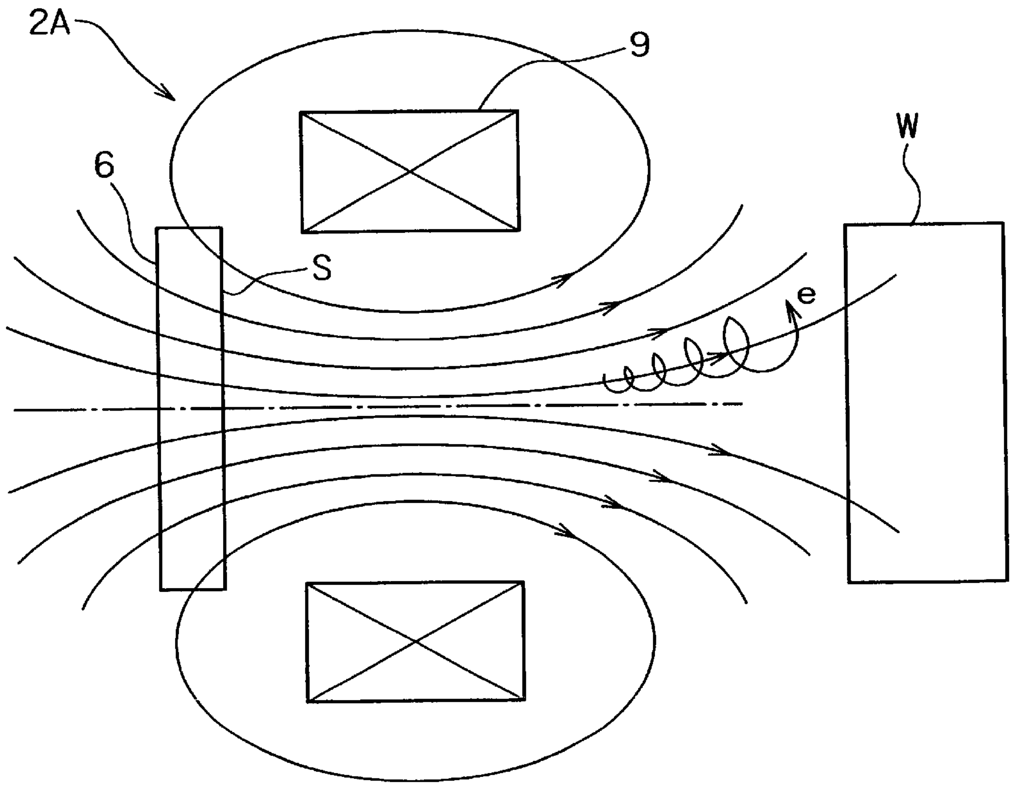
FIG. 3 is a schematical enlarged sectional view of an important part of another arc type evaporating source to be used for carrying out the present invention.

FIG. 2 is a schematical enlarged sectional view of an example of an important part of the arc type evaporating source used for carrying out the present invention. The magnet 8, serving as the magnetic field forming means, is arranged in such manner that it encloses the evaporating surface S of the target 6. The magnetic field forming means is not limited to the magnet, and an electromagnet comprising coil and coil power source may be used. As shown in FIG. 3, the magnet may be arranged in such manner that it encloses a space in front of the evaporating surface S (i.e. a space closer to the material to be processed) of the target 6. In FIG. 2, the chamber serves as anode, while a special-purpose anode of cylindrical shape to enclose a space in front of the side of the target may be provided.

Figure 4:
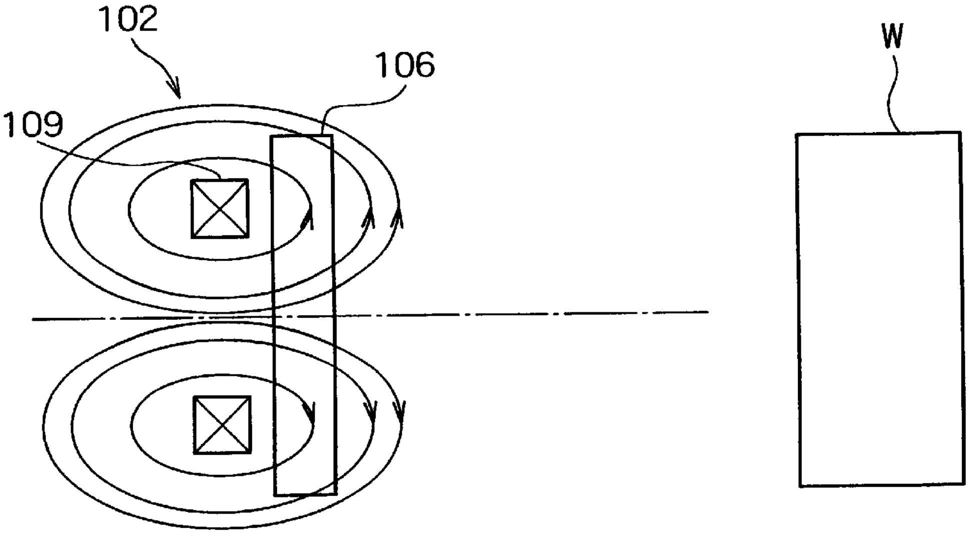
FIG. 4 is a schematical enlarged sectional view of an example of an important part of an arc type evaporating source as used in the past.

An arc type evaporating source 102 in the conventional type AIP apparatus as shown in FIG. 4 may be provided with an electromagnet 109 for concentrating arc discharge on the target 106. Because the electromagnet 109 is positioned on rear side of the target 106, the line of magnetic force runs in parallel to the target surface near the evaporating surface of the target so that the line of magnetic force does not extend toward the vicinity of the material to be processed W.

The difference between the arc type evaporating source of the AIP apparatus used in the present invention and the magnetic field structure of the conventional example lies in the difference of how the plasma is spreading in the atmospheric gas.

As shown in FIG. 3, a part of electrons "e" generated by discharge are moved along as if the electrons are wound on the line of magnetic force. When these electrons collide with nitrogen molecules in the film-forming gas, the film-forming gas is turned to plasma. In case of the conventional type evaporating source 102 shown in FIG. 4, the position of the line of magnetic force is limited to the vicinity of the target. Thus, the density of the plasma of the film-forming gas generated as described above is at the highest near the target, and plasma density is considerably decreased near the material to be processed (workpiece) W. In contrast, in the evaporating source used in the present invention as shown in FIG. 2 and FIG. 3, the line of magnetic force is extended to the material to be processed W. Thus, plasma density of the film-forming gas near the material to be processed W is far higher compared with the case of the conventional type evaporating source.

Figure 5:
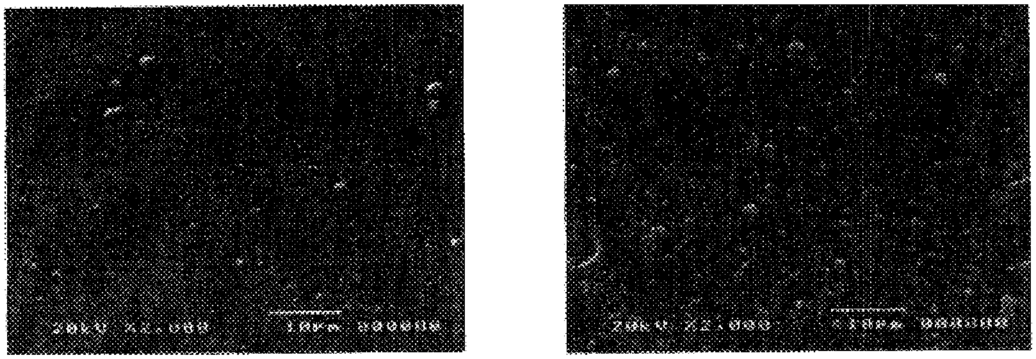
FIG. 5 shows surface electron micrographs of $(Ti_{0.15}Al_{0.7}V_{0.15})N$ film formed.

The difference of the arrangement of the line of magnetic force on the target surface and plasma density near the substrate (material to be processed) may exert extensive influence on crystal structure of the formed film and the characteristics to be obtained. FIG. 5 shows an embodiment to confirm such influence, and it represents surface electron micrographs of the film when the film $(Ti_{0.15}Al_{0.7}V_{0.15})N$ of the present invention is formed. The micrographs were taken by using the conventional type evaporating source and the arc type evaporating source of the present inventors respectively. Film-forming conditions for both evaporating sources were as follows: arc current: 100 A; pressure of nitrogen gas: 2.66 Pa; temperature of substrate (material to be processed): 500° C.; and bias voltage of the substrate (material to be processed): 100 V. Bias potential is applied in such manner that it will be negative with respect to earth potential. For instance, bias potential of 100 V indicates that bias potential to earth potential is −100 V.

As shown in FIG. 5(1), the surface of the film is formed by the evaporating source of the AIP apparatus of the present inventors, in which the magnet is positioned on lateral side or in front of the target, and the surface of the film is very smooth. On the other hand, in case of the film formed by the conventional type evaporating source, in which the magnet is positioned on rear side of the target, molten target substance called "macro-particles" are attached on the film surface as shown in FIG. 5(2). Thus, surface roughness (Ra) is higher, and this adversely affects the cutting characteristics. Therefore, it is very effective to use the evaporating source of the present invention for film-forming purpose.

The bias voltage applied on the substrate (material to be processed) during film-forming operation is preferably in the range of 50 V to 300 V. Generally speaking, AlN of the rock salt structure is a substance, which is in the state of non-equilibrium at normal temperature and under normal pressure and which is very difficult to generate. By the evaporating source of the present inventors, the conversion of the film-forming gas to plasma is promoted, and the film-forming gas can be ionized. As a result, by applying bias voltage on the substrate, it appears that ion impact is effectively applied on the substrate (material to be processed), and the formation of AlN of rock salt structure is promoted. In order to have such effects, it is preferable to apply the bias voltage of 50 V or more, or more preferably, 70 V or more. However, if the bias voltage is too high, the film may be etched by the ionized film-forming gas, and film-forming rate or speed is extremely reduced. In this connection, the bias voltage is preferably 300 V or lower, or more preferably 260 V or lower. If promotive action of the formation of AlN of rock salt structure and film-forming rate are taken into account, it is preferable that the bias voltage applied on the substrate is in the range of 70 V to 200 V.

Figure 6:
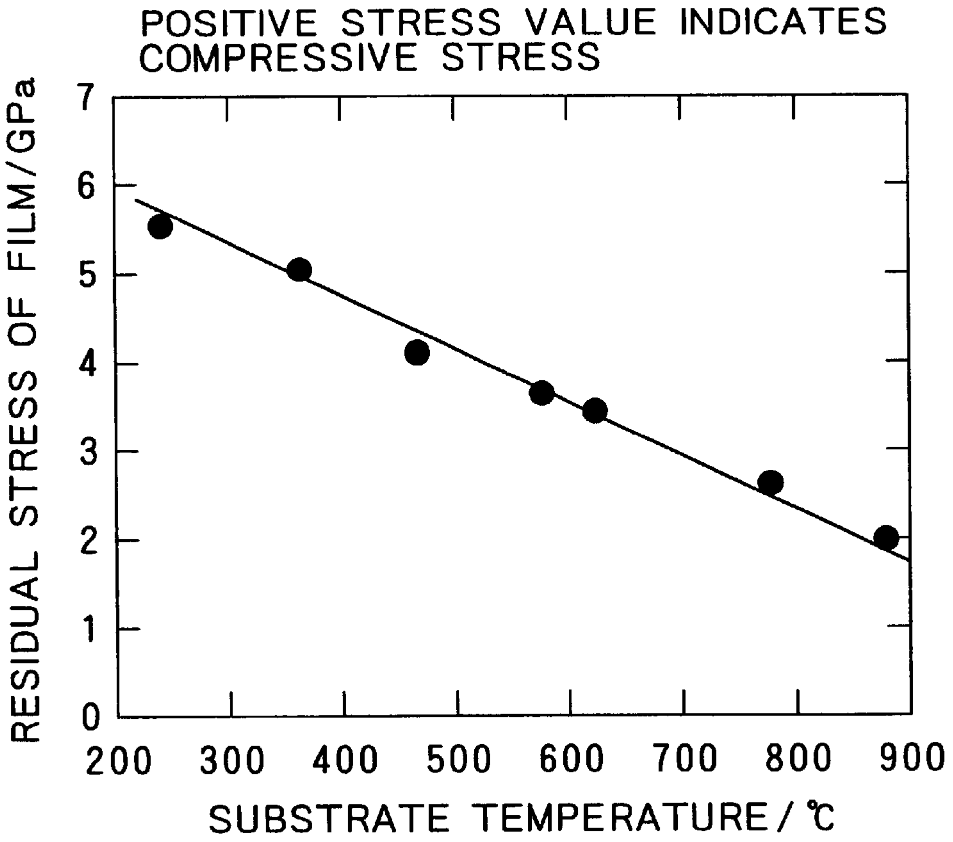
FIG. 6 is a graph showing the relation between substrate temperature and residual stress in the film having a composition of $(Ti_{0.1}Al_{0.7}Cr_{0.1}V_{0.1})N$.

According to the present invention, the range of the temperature of the substrate (material to be processed) during film formation is preferably in the range of 300° C. to 800° C., and this is related to the stress in the formed film. FIG. 6 shows an example of the relation between the temperature of the substrate (material to be processed) and residual stress of the formed film when $(Ti_{0.1}Al_{0.7}Cr_{0.1}V_{0.1})N$ is formed. Experiment was performed with bias voltage of 150 V on the substrate during film-forming and pressure of nitrogen was set to 2.66 Pa. From FIG. 6, it is evident that, when the temperature of the substrate (material to be processed) is increased, residual stress of the film tend to decrease. When excessive residual stress is applied in the hard film obtained, the film may be peeled off under film-forming state, and it is inferior in close fitness. Therefore, the lower limit of the substrate temperature is preferably set to 300° C., or more preferably 400° C. On the other hand, when substrate temperature is increased, the residual stress is decreased. If residual stress is too low, compressive stress is decreased. This impairs the action of the substrate to reinforce resistance to breakage and also results in thermal degeneration of the substrate due to high temperature. Accordingly, the upper limit of the substrate temperature is preferably set to 800° C., or more preferably to 700° C. or lower.

Further, according to the present invention, the preferable film-forming condition is to set partial pressure or total pressure of the reactive gas during film formation to the range of 0.5 Pa to 6 Pa. Here, the expression of partial pressure or total pressure" of the reactive gas is used. In the present invention, the gas containing the elements necessary for the composition of the film such as nitrogen gas or methane gas is called "reactive gas", and rare gas such as argon is called "assist gas", and these gases are called together as "film-forming gas". In case the assist gas is not used and only the reactive gas is used as the film-forming gas, it is effective to control total pressure of the reactive gas. In case both of the reactive gas and the assist gas are used, it is effective to control the partial pressure of the reactive gas. In case the partial pressure or the total pressure of the reactive gas is lower than 0.5 Pa and when the target is subjected to arc evaporation, a large amount of macro-particles (molten part of the target) are attached on film surface, and this results in higher surface roughness of the film. This is not desirable because inconveniences may arise depending on the application. On the other hand, in case partial pressure or total pressure of the reactive gas exceeds 6 Pa, the reactive gas collides with evaporated particles of the components of the target. This leads to dispersion of the evaporated particles and to the decrease of the film-forming rate, and this is not desirable. The lower limit of partial pressure or total pressure of the reactive gas is preferably set to 1 Pa, and the upper limit is preferably set to 5 Pa. More preferably, the lower limit is set to 1.5 Pa, and the upper limit is set to 4 Pa.

In the present invention, description has been given on the AIP method as the film-forming method. There is no special restriction on the AIP method so far as the conversion of the film-forming gas together with metal elements into plasma can be promoted. For instance, film may be formed by the pulse sputtering method or the nitrogen ion beam assist deposition method.

It is effective to manufacture the hard film of the present invention by evaporating or ionizing the target as described above and by using vapor phase coating method such as ion plating method to form the film on the material to be processed or by sputtering method, etc. In case the target has unfavorable characteristics, stable discharge condition cannot be maintained during film formation, and problems may arise such as non-uniform composition of the film obtained. In this respect, in order to obtain the hard film of the present invention, which exhibits high wear resistance, studies have been performed on the characteristics of the target used. As a result, the following findings were obtained.

First, it has been found that, by setting relative density of the target to 95% or more, discharge condition during film-forming operation is turned to stable and the hard film of the present invention can be obtained efficiently. That is, when relative density of the target is less than 95%, micro-voids containing alloy component in sparse distribution are generated in the target. When such a target is used for formation of film, the alloy components are evaporated not uniformly, and this results in wider variation of the composition of the film obtained or non-uniform film thickness. Also, voids are worn out locally and rapidly during the formation of film. This leads to higher wearing rate and shorter service life of the target. In case there are many voids, wearing occurs locally and rapidly. This means that the target is extensively deteriorated and may be cracked.

Even when relative density of the target is 95% or more, if the voids in the target are large, discharge condition is turned to unstable, and the film is not formed satisfactorily, and this is not desirable. If there exist voids of 0.5 mm or more in radius in the target, alloy components of the target are evaporated or ionized. As a result, arc discharge is interrupted, and film cannot be formed. After fervent study on this point, the present inventors have found that, when radius of the void is 0.3 mm or more, discharge condition is turned to unstable even when discharge is not interrupted. Therefore, for the purpose of maintaining stable discharge condition and to form the film satisfactorily and efficiently, it is preferable to set the radius of void in the target to less than 0.3 mm, or more preferably, to 0.2 mm or less.

In the vapor phase coating method such as AIP method, the composition of the formed film is determined by the composition of the target used. Therefore, it is preferable that the composition of the target is the same as the composition of the film to be produced. Specifically, when the first hard film with composition given by $(Al_b,[Cr_{1-\alpha}V_\alpha]_c)(C_{1-d}N_d)$ is to be formed as the hard film of the present invention exhibiting high wear resistance, it is preferable to use a target, which comprises $(Al_y,[Cr_{1-\beta}V_\beta]_z)$ and satisfies the conditions:

$0.5 \leqq y \leqq 0.8,$ $0.2 \leqq z \leqq 0.5,$ $y+z=1,$ $0.05 \leqq \beta \leqq 0.95$ (where y and z each represents atomic ratio of A and Cr+V, and β denotes atomic ratio of V).

Also, when the second hard film with composition of $(M_\alpha,Al_b,[Cr_{1-\alpha}V_\alpha]_c)(C_{1-d}N_d)$ is to be formed, it is preferable to use a target, which comprises $(M_x,Al_y,[Cr_{1-\beta}V_\beta]_z)$, where M is at least one element selected from Ti, Nb, W, Ta and Mo, and satisfies the conditions:

$0.02 \leqq x \leqq 0.3,$ $0.5 \leqq y \leqq 0.8,$ $0.05 \leqq z,$ $x+y+z=1,$ $0 \leqq \beta \leqq 1$ (where x, y and z each represents atomic ratio of M, Al, Cr +V, and β denotes atomic ratio of V). In order to form the hard film where M is Ti in the preferred aspect of the present invention, it is preferable to use a target where M is Ti.

For the preferred hard film of the present invention when α=1, i.e. the hard film having the value of atomic ratio (b+c) of Al+V as 0.7 or more, the value of b is in the range of 0.5 to 0.8, and the value of c is more than 0.05, it is preferable to use a target, in which the value of z is $0.5<y \leqq 0.8$, $0.05<z$, $0.7 \leqq y+z$, and β=1, depending on the composition of the hard film to be produced.

Even when the composition of the target as described above may be satisfied, if there is wide variation in the distribution of composition in the target, the distribution of the composition of the hard film obtained is not uniform, and wear resistance of the film may be partially different. Also, if there is wide variation in the distribution of composition of the target, local difference may occur in electrical conductivity, melting point, etc. in the target. This makes the discharge condition unstable and results in the failure to achieve film formation satisfactorily. Therefore, in the target of the present invention, variation in the composition distribution is preferably within 0.5 atom %.

Further, impurities (oxygen, hydrogen, chlorine, copper, and magnesium) are unavoidably intermingled in the target due to raw materials used for the manufacture of the target or due to atmosphere during the manufacture of the target. The content of these impurities exerts influence on the conditions such as discharge condition during film formation. The present inventors have also studied such influence.

As a result, when oxygen, hydrogen, and chlorine are contained in the target in large amount, these gases are suddenly generated from the target during film formation. This results in unstable discharge condition, or in the worst case, the target itself may be damaged, and the film cannot be formed satisfactorily. In this respect, it is preferable to set the amount of oxygen in the target to 0.3 mass % or less, the amount of hydrogen to 0.05 mass % or less, and the amount of chlorine to 0.2 mass % or less. More preferably, the amount of oxygen is set to 0.2 mass %, hydrogen to 0.02 mass % or less, and chlorine to 0.015 mass % or less.

Copper or magnesium has higher vapor pressure than M, Al, Cr and V contained in the target of the present invention and are more easily evaporated. If copper or magnesium is contained in large amount, these are gasified during the manufacture of the target, and voids are generated in the target. Such defective condition may cause unstable discharge condition during film-forming operation. Therefore, the content of copper in the target is preferably limited to 0.05 mass % or less, or more preferably to 0.02 mass %. The content of magnesium is preferably limited to 0.03 mass % or less, or more preferably to 0.02 mass % or less.

As a method to reduce the content of the impurities to the range defined in the present invention, there are methods such as vacuum melting of raw material powder, or blending and mixing of the raw material powder under clean atmosphere.

Incidentally, the present invention does not specify the method for manufacturing the target. However, the effective method to obtain the target of the present invention may be as follows: For instance, volume ratio, particle size, etc. are adequately adjusted in the powder of the element M of the raw material, Cr powder, v powder, or Al powder, and these are uniformly mixed using a V-type mixer to obtain mixed powder. Then, the powder is pressed by cold isostatic pressing (CIP processing) or hot isostatic pressing (HIP processing). In addition to these methods, hot extrusion method or ultra-high pressure hot press method may be used for the manufacture of the target of the present invention.

As described above, when the mixed powder is prepared as described above, the target may be manufactured by hot pressing (HP). When this method is used, the element V used in the present invention is a metal with high melting point, and there is a problem in that a target with high relative density is difficult to obtain. Also, in addition to the method to manufacture the target by using the mixed powder as described above, there are the following methods: a method to use the powder, being turned to alloy in advance, and to perform CIP processing, HIP processing, or a method to obtain the target by melting and coagulation. However, the method to perform CIP processing or HIP processing by using the alloy powder has an advantage in that a target with uniform composition can be obtained, but the alloy powder is poor in sintererability, and it is difficult to obtain the target with high density. The method to melt and coagulate the alloy powder is advantageous in that a target with relatively uniform composition can be obtained. However, there are problems such as possibility of cracking or shrinkage cavity during coagulation, and it is difficult to obtain the target of the present invention.

EXAMPLES

In the following, detailed description will be given on the present invention referring to examples, while the present invention is not limited to the examples given below, and changes and modifications can be made without departing from the spirit and the scope of the present invention, and these features are all included in the technical scope of the present invention.

Example 1

On a cathode of an AIP apparatus as shown in FIG. 1, an alloy target comprising [Al,Cr,V] or [M (one type or more of Ti, Nb, w, Ta, Mo), Al, Cr,V] was attached. Further, a cemented carbide tip and a cemented carbide end mill (10 mm in diameter; with 2 edges) were attached on a holder as the materials to be processed, and the space inside the chamber was turned to vacuum condition. Then, the temperature of the object to be processed is heated up to 500° C. by a heater in the chamber. Nitrogen gas was introduced to set the pressure in the chamber to 2.66 Pa. Then, arc discharge was started, and a film of 3 μm in thickness was formed on the surface of the substrate (object to be processed). During film-forming operation, bias voltage of 100 V to 150 V was applied on the substrate (object to be processed) so that the substrate is turned to negative potential with respect to the earth potential.

After the completion of the film formation, metal composition in the film, crystal structure of the film, and Vickers hardness were determined. The composition of metal elements in the film was determined by EPMA. It was found that the content of oxygen was 1 atom % or less, and the content of carbon was 2 atom % or less. The composition ratio of metal elements ((Al, Cr, V) or [H (at least one element selected from Ti, Nb, W, Ta and Mo), Al, Cr, v]), to nonmetallic elements (C, N) is almost 1 to 1. The crystal structure of the film was identified by X-ray diffraction. The value of the expression (4) given above was determined by measuring the peak intensity of each crystal plane using Cu Kα line on X-ray diffraction apparatus. Further, in order to evaluate wear resistance, an end mill with the hard film formed on it was used. Cutting test was performed under the conditions given below, and the worn width (i.e. the width of the worn part) in the middle of edge was determined.

Cutting conditions:

Object to be cut: JIS-SKD61 (HRC50)
Cutting speed: 200 m/min.
Feed speed: 0.06 mm/edge
Cutting depth in axial direction: 5 mm
Cutting depth in radial direction: 1 mm
Cutting length: 30 m
Others: Down cutting, dry cutting, and air blow only.

Composition of the film obtained, crystal structure, Vickers hardness, and the worn width measured in the expression (4) and in the cutting test are summarized in Tables 1 to 3.

TABLE 1

| Experiment | Film composition (atomic ratio) | | | | | | Crystal | Value of | Hardness | Worn width |
|---|---|---|---|---|---|---|---|---|---|---|
| No. | Ti | Al | Cr | V | C | N | structure* | expression(4) | (HV) | (μm) |
| 1 | 0.4 | 0.6 | 0 | 0 | 0 | 1 | B | 1 | 2800 | 45.8 |
| 2 | 1 | 0 | 0 | 0 | 0 | 1 | B | 1 | 2400 | 98.9 |
| 3 | 1 | 0 | 0 | 0 | 0.5 | 0.5 | B | 1 | 2700 | 54.9 |
| 4 | 0 | 0.4 | 0.3 | 0.3 | 0 | 1 | B | 1 | 2600 | 66.3 |
| 5 | 0 | 0.55 | 0.2 | 0.25 | 0 | 1 | B | 1 | 3020 | 31.4 |
| 6 | 0 | 0.65 | 0.2 | 0.15 | 0 | 1 | B | 1 | 3050 | 29.8 |
| 7 | 0 | 0.75 | 0.1 | 0.15 | 0 | 1 | B | 1 | 3100 | 27.5 |

TABLE 1-continued

| Experiment No. | Film composition (atomic ratio) Ti | Al | Cr | V | C | N | Crystal structure* | Value of expression(4) | Hardness (HV) | Worn width (μm) |
|---|---|---|---|---|---|---|---|---|---|---|
| 8 | 0 | 0.85 | 0.07 | 0.08 | 0 | 1 | B + H | 0.2 | 2500 | 80.7 |
| 9 | 0 | 0.65 | 0.01 | 0.34 | 0 | 1 | B | 1 | 2870 | 40.5 |
| 10 | 0 | 0.65 | 0.34 | 0.01 | 0 | 1 | B | 1 | 2850 | 41.9 |

*B represents rock salt structure, and H represents ZnS structure.

TABLE 2

| Experiment No. | Film composition (atomic ratio) M*[1] | | Al | Cr | V | C | N | Crystal structure*[2] | Value of expression(4) | Hardness (HV) | Worn width (μm) |
|---|---|---|---|---|---|---|---|---|---|---|---|
| 11 | 0.2 | Ta | 0.4 | 0.25 | 0.15 | 0 | 1 | B | 1 | 2600 | 66.3 |
| 12 | 0.3 | Ti, W | 0.4 | 0.15 | 0.15 | 0 | 1 | B | 1 | 2550 | 73.1 |
| 13 | 0.5 | Ti, Nb | 0.4 | 0.05 | 0.05 | 0 | 1 | B | 1 | 2400 | 98.9 |
| 14 | 0.35 | Nb, Mo | 0.6 | 0.025 | 0.025 | 0 | 1 | B | 1 | 2700 | 54.9 |
| 15 | 0.08 | Ta, Mo | 0.85 | 0.03 | 0.04 | 0 | 1 | B + H | 0.5 | 2450 | 89.2 |
| 16 | 0.1 | Ti, Nb | 0.55 | 0.15 | 0.2 | 0 | 1 | B | 1 | 2950 | 35.3 |
| 17 | 0.2 | Ti, Ta, Nb | 0.55 | 0.1 | 0.15 | 0 | 1 | B | 1 | 2900 | 38.4 |
| 18 | 0.25 | Nb, Ta | 0.67 | 0.05 | 0.03 | 0 | 1 | B | 1 | 2950 | 35.3 |
| 19 | 0.14 | Ti, Mo | 0.63 | 0.11 | 0.12 | 0 | 1 | B | 1 | 3000 | 32.4 |
| 20 | 0.07 | Nb, Mo | 0.7 | 0.12 | 0.11 | 0 | 1 | B | 1 | 3005 | 32.2 |
| 21 | 0.1 | Ti, Ta | 0.76 | 0.07 | 0.07 | 0 | 1 | B + H | 0.9 | 3050 | 29.8 |
| 22 | 0.1 | Ti, Nb | 0.7 | 0.1 | 0.1 | 0 | 1 | B | 1 | 3100 | 27.5 |
| 23 | 0.28 | Ti, Nb | 0.65 | 0 | 0.07 | 0 | 1 | B | 1 | 3000 | 32.4 |
| 24 | 0.28 | Ti, Ta | 0.65 | 0.07 | 0 | 0 | 1 | B | 1 | 3050 | 29.8 |
| 25 | 0.15 | Nb | 0.65 | 0.2 | 0 | 0 | 1 | B | 1 | 3150 | 27.5 |

*[1]When many elements are added, atomic ratio of each element is determined by equipartition of adding amounts of M elements.
*[2]B represents rock salt structure, and H represents ZnS structure.

TABLE 3

| Experiment No. | Film composition (atomic ratio) Ti | Al | Cr | V | C | N | Crystal structure* | Value of expression(4) | Hardness (HV) | Worn width (μm) |
|---|---|---|---|---|---|---|---|---|---|---|
| 26 | 0.2 | 0.4 | 0.25 | 0.15 | 0 | 1 | B | 1 | 2600 | 66.3 |
| 27 | 0.3 | 0.4 | 0.15 | 0.15 | 0 | 1 | B | 1 | 2550 | 73.1 |
| 28 | 0.5 | 0.4 | 0.05 | 0.05 | 0 | 1 | B | 1 | 2400 | 98.9 |
| 29 | 0.35 | 0.6 | 0.025 | 0.025 | 0 | 1 | B | 1 | 2700 | 54.9 |
| 30 | 0.08 | 0.85 | 0.03 | 0.04 | 0 | 1 | B + H | 0.5 | 2450 | 89.2 |
| 31 | 0.1 | 0.55 | 0.15 | 0.2 | 0 | 1 | B | 1 | 3000 | 32.4 |
| 32 | 0.2 | 0.55 | 0.1 | 0.15 | 0 | 1 | B | 1 | 2950 | 35.3 |
| 33 | 0.25 | 0.67 | 0.05 | 0.03 | 0 | 1 | B | 1 | 3000 | 32.4 |
| 34 | 0.14 | 0.63 | 0.11 | 0.12 | 0 | 1 | B | 1 | 3050 | 29.8 |
| 35 | 0.07 | 0.7 | 0.12 | 0.11 | 0 | 1 | B | 1 | 3055 | 29.6 |
| 36 | 0.1 | 0.76 | 0.07 | 0.07 | 0 | 1 | B + H | 0.9 | 3100 | 27.5 |
| 37 | 0.1 | 0.7 | 0.1 | 0.1 | 0 | 1 | B | 1 | 3150 | 25.4 |
| 38 | 0.38 | 0.55 | 0.005 | 0.065 | 0 | 1 | B | 1 | 2750 | 50.1 |
| 39 | 0.38 | 0.55 | 0.065 | 0.005 | 0 | 1 | B | 1 | 2780 | 47.4 |

*B represents rock salt structure, and H represents ZnS structure.

From Tables 1 to 3, it is evident that in the specimens Nos. 5–7, 16–25, and 31–37, high Vickers hardness could be achieved, and the wearing in the cutting test was also limited to less than 40 μm. In contrast, in the Experiments Nos. 1–3, in which (Ti, Al)N film, TiN film and TiCN films were formed as conventional examples, and in the Experiments Nos. 4, 8–15, 26–30, 38 and 39, which have the same component elements as the hard film of the present invention but the composition was out of the range defined in the present invention, the hardness was as low as HV 2900 or lower, and the worn width was 40 μm or more in the cutting test.

Figure 7:
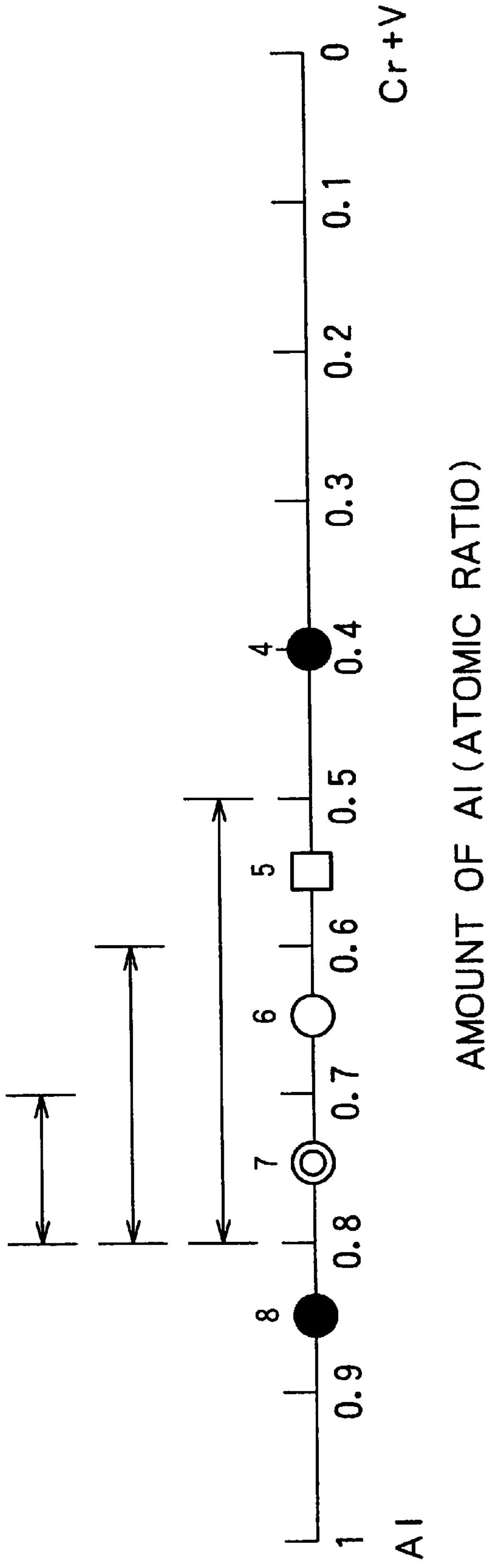
FIG. 7 is a diagram of the composition of metal components Al, Cr and V in (Al,Cr,V)N film, showing the range of the present invention and the examples.
Figure 8:
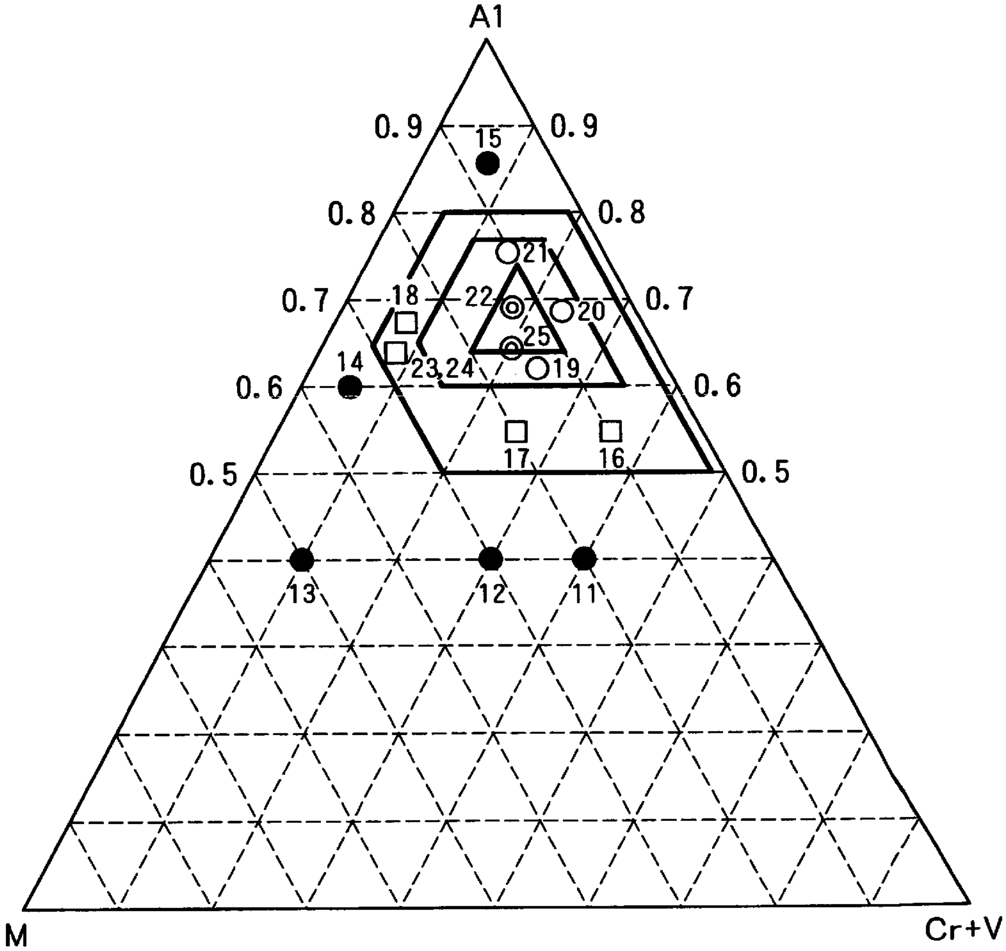
FIG. 8 is a diagram of the composition of metal components M, Al, Cr and V in (M,Al,Cr,V)N film, showing the range of the present invention and the examples.
Figure 9:
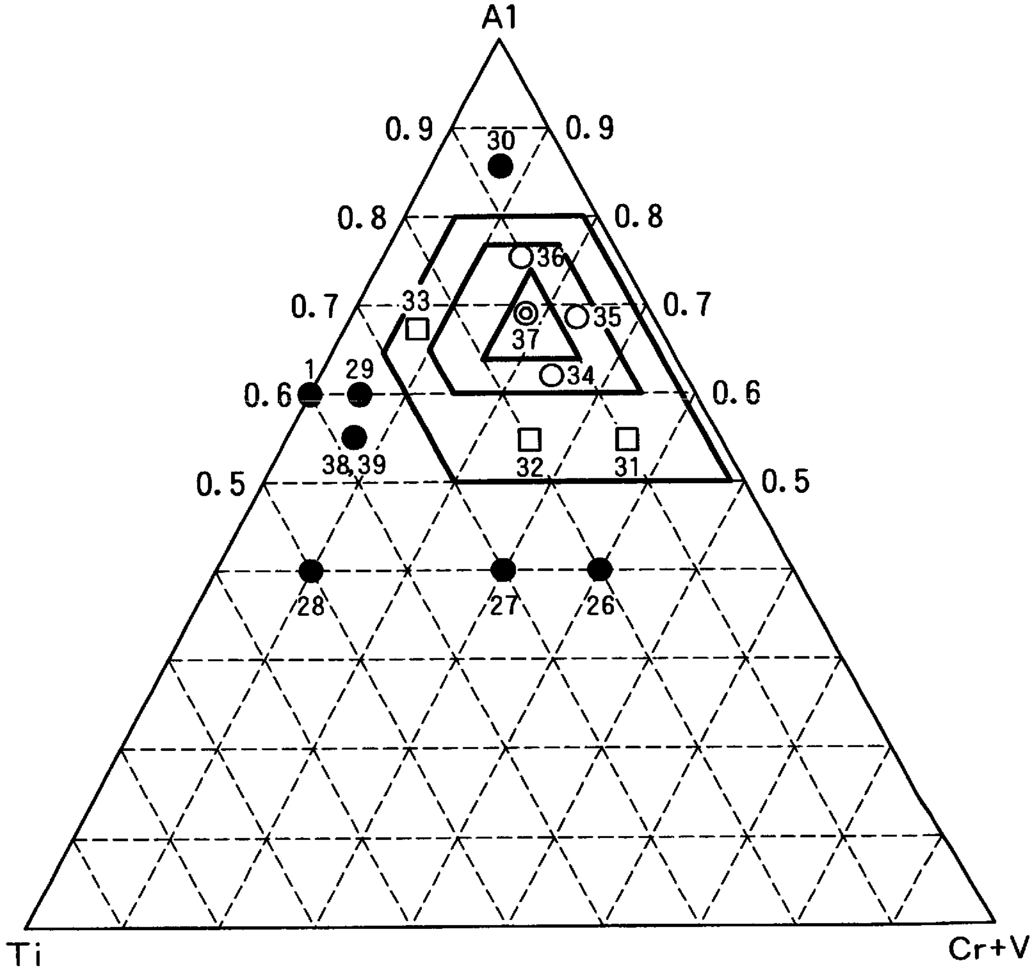
FIG. 9 is a diagram of the composition of metal components Ti, Al, Cr and V in (Ti,Al,Cr,V)N film, showing the range of the present invention and the examples.

FIGS. 7 to 9 each represents a diagram of the composition of metal elements in (Al,Cr,V)N film, (M,Al,Cr,V)N film, and (Ti,Al,Cr,V)N film, showing the range of the present invention and examples of the Experiments Nos. 4 to 39. In FIGS. 7 to 9, the regions enclosed by boundary lines of the marks ● and □ each indicates the range of the present invention, and the regions enclosed by boundary lines of the marks □ and ○ each indicates the range of the preferred aspects of the present invention. Further, the regions enclosed by the boundary lines of ○ and ⊙ each indicates the range of the more preferred aspects of the present invention. As shown in these figures and in Tables 1 to 3, the Experiments Nos. 5–7, 16–25 and 31–37 in the range of the present invention indicated by the marks ⊙, ○ and □ in FIGS. 7 to 9 each indicates the film with higher hardness compared with the Experiments Nos. 4, 8, 11–15 and 26–30, which do not satisfy the compositions defined in the present invention shown by the mark ● in FIGS. 7 to 9. In particular, the Experiments Nos. 6, 7, 19–22, 25 and 34–37 within the range of the preferred compositions as indicated by the marks ◎ and ○ in FIGS. 7 to 9 provided the results of higher hardness and higher wear resistance.

Example 2

On a cathode of an AIP apparatus as shown in FIG. 1, an alloy target comprising Ti, V and Al was attached. Further, a cemented carbide tip and a cemented carbide end mill (10 mm in diameter; with 4 edges) were attached on the holder as objects to be processed, and the space inside the chamber was turned to vacuum condition. Then, by a heater in the chamber, the temperature of the objects to be processed was heated up to 500° C. Nitrogen gas was introduced and the pressure in the chamber was set to 2.66 Pa. Arc discharge was started, and a film of 3 $\mu$m in thickness was formed on the surface of each of the objects to be processed. During film-forming operation, bias voltage of 100 V was applied on the substrate (object to be processed) so that the substrate will be turned to negative potential with respect to the earth potential.

After the completion of film formation, metal composition in the film, crystal structure, and Vickers hardness of the film were determined. The compositions of Ti, V and Al in the film were determined by EPMA. Impurities elements other than metal elements (Ti, V, Al) in the film and nitrogen were determined. Oxygen content was 1 atom % or less, and carbon content was 2 atom % or less. The composition ratio of metal elements (Ti, V, Al) to nonmetallic elements (C, N) is almost 1 to 1. Crystal structure of the film was identified by X-ray diffraction. The value of the expression (4) was determined by measuring the peak intensity of each crystal plane using K$\alpha$ line of Cu by X-ray diffraction apparatus as described above. Further, to evaluate wear resistance, cutting test was performed under the conditions given below using the end mill with the hard film formed on it, and the worn width at the middle of the edge was determined.

Cuttings conditions:

Workpiece: JIS-SKD61 (HRC50)

Cutting speed: 190 m/min.

Feed speed: 0.05 mm/edge

Cutting depth in axial direction: 5 mm

Cutting depth in radial direction: 1 mm

Cutting length: 30 m

Others: Down cutting, dry cutting, and air blow only

Composition crystal structure, Vickers hardness of the formed film, and the value of the worn width as determined by the expression (4) and the cutting test are summarized in Table 4.

TABLE 4

| Experi-ment No. | Film composition (atomic ratio) Ti | Al | V | C | N | Crystal structure* | Value of expression (4) | Hardness (HV) | Worn width ($\mu$m) |
|---|---|---|---|---|---|---|---|---|---|
| 1 | 0.25 | 0.55 | 0.2 | 0 | 1 | B | 1 | 3100 | 27.5 |
| 2 | 0.15 | 0.55 | 0.3 | 0 | 1 | B | 1 | 3200 | 23.5 |
| 3 | 0.05 | 0.55 | 0.4 | 0 | 1 | B | 1 | 3150 | 25.4 |
| 4 | 0.25 | 0.65 | 0.1 | 0 | 1 | B | 1 | 3250 | 21.7 |
| 5 | 0.15 | 0.65 | 0.2 | 0 | 1 | B | 1 | 3300 | 20.1 |
| 6 | 0.1 | 0.65 | 0.25 | 0 | 1 | B | 1 | 3350 | 18.7 |
| 7 | 0.15 | 0.7 | 0.15 | 0 | 1 | B | 1 | 3500 | 15.0 |
| 8 | 0.1 | 0.7 | 0.2 | 0 | 1 | B | 1 | 3450 | 16.1 |
| 9 | 0.11 | 0.74 | 0.15 | 0 | 1 | B | 1 | 3400 | 17.3 |
| 10 | 0.15 | 0.78 | 0.07 | 0 | 1 | B + H | 0.85 | 3100 | 27.5 |
| 11 | 0.07 | 0.78 | 0.15 | 0 | 1 | B + H | 0.9 | 3150 | 25.4 |
| 12 | 0.4 | 0.4 | 0.2 | 0 | 1 | B | 1 | 2800 | 45.8 |
| 13 | 0.25 | 0.45 | 0.3 | 0 | 1 | B | 1 | 2850 | 41.9 |
| 14 | 0.15 | 0.45 | 0.4 | 0 | 1 | B | 1 | 2870 | 40.5 |
| 15 | 0.05 | 0.45 | 0.5 | 0 | 1 | B | 1 | 2800 | 38.4 |
| 16 | 0.35 | 0.55 | 0.1 | 0 | 1 | B | 1 | 2860 | 41.2 |
| 17 | 0.23 | 0.74 | 0.03 | 0 | 1 | B + H | 0.65 | 2600 | 66.3 |
| 18 | 0.1 | 0.85 | 0.05 | 0 | 1 | H | 0 | 2650 | 60.3 |
| 19 | 0.05 | 0.85 | 0.1 | 0 | 1 | H | 0 | 2550 | 73.1 |
| 20 | 0 | 0.6 | 0.4 | 0 | 1 | B | 1 | 2800 | 38.4 |
| 21 | 0 | 0.5 | 0.5 | 0 | 1 | B | 1 | 2850 | 35.3 |
| 22 | 0.5 | 0.5 | 0 | 0 | 1 | B | 1 | 2500 | 80.7 |
| 23 | 0.4 | 0.6 | 0 | 0 | 1 | B | 1 | 2800 | 45.8 |

*B represents rock salt structure, and H represents ZnS structure.

From Table 4, it is evident that Experiments Nos. 1 to 11 satisfying the range of compositions of the present invention, and high film hardness can be maintained. The results of the cutting test showed less wearing with the worn width, being less than 30 $\mu$m. In contrast, the Experiments Nos. 12–23 did not satisfy the compositions of Ti, Al, and V defined in the present invention. Hardness was HV 2900 or less in each of these Experiments. The results of the cutting test revealed poor wear resistance with the worn width of 30 $\mu$m or more.

Figure 10:
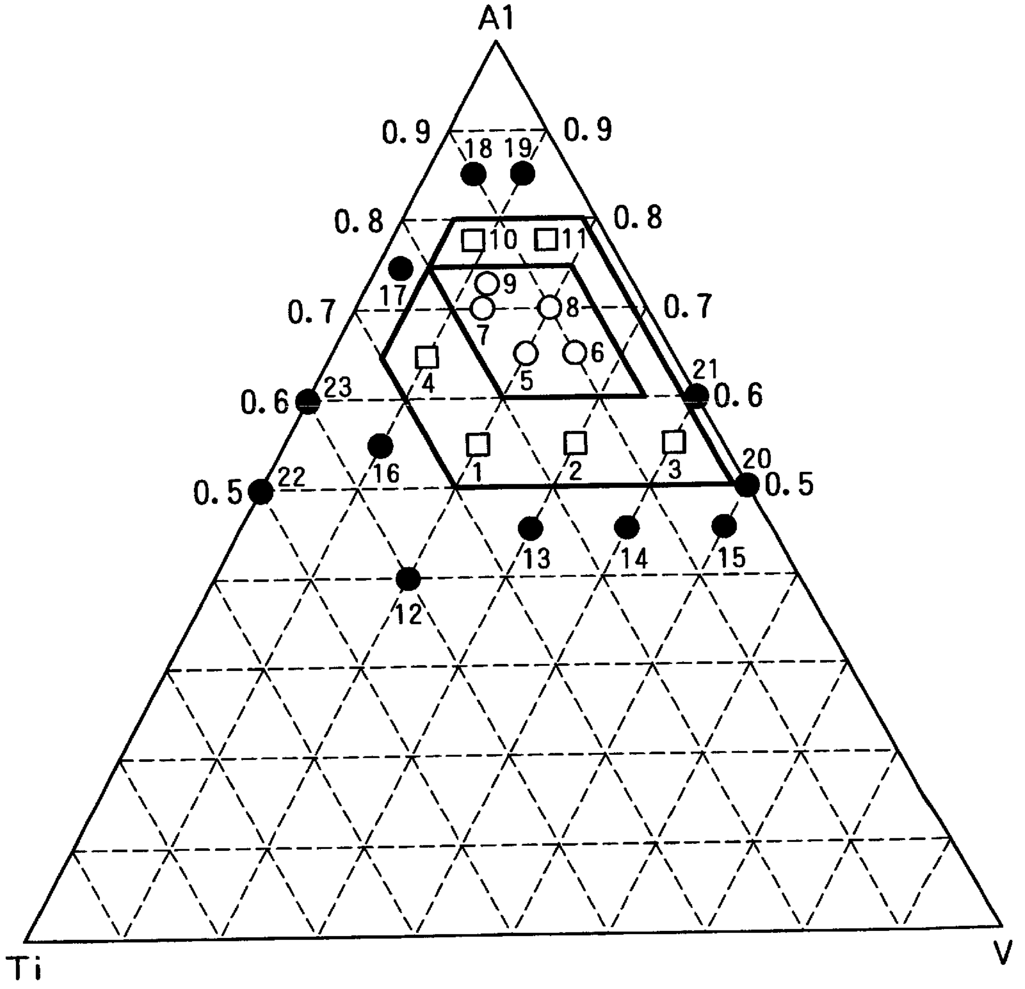
FIG. 10 is a diagram of the composition of metal components Ti, Al and V in (Ti,Al,V)N film, showing the range of the present invention and the examples.

FIG. 10 is a diagram of the compositions of the metal components Ti, Al and V in the (Ti,Al,V)N film, showing the range of the present invention and the Experiments Nos. 1 to 23. In FIG. 10, the regions enclosed by boundary lines of the marks ● and □ each indicates the range defined in the present invention. The regions enclosed by boundary lines of the marks □ and ○ each indicates the range of the preferred aspects of the present invention. In FIG. 10, the Experiments Nos. 1 to 11 within the range of the present invention indicated by the marks ○ and □ showed higher film hardness compared with the Experiments Nos. 12 to 23, which did not satisfy the compositions defined in the present invention as shown by the mark ● in FIG. 10. In particular, the Experiments Nos. 5 to 9 in the range of the preferred compositions indicated by the mark ○ in FIG. 10 provided the results with very high hardness and high wear resistance.

Example 3

Next, an alloy target comprising [Al,Cr,V] or [M (one type or more of Ti, Nb, W, Ta, and Mo), Al,Cr,V] was attached to a cathode of an AIP apparatus shown in FIG. 1. Further, a cemented carbide tip and a cemented carbide end mill (10 mm in diameter; with 2 edges) were attached on the holder as objects to be processed, and the space inside the chamber was turned to vacuum condition. The temperature of the objects to be processed was heated up to 500° C. by a heater in the chamber. Mixed gas of nitrogen and methane was introduced, and the pressure inside the chamber was set to 2.66 Pa. Arc discharge was started, and a film of 3 μm in thickness was formed on the surface of each of the substrates (objects to be processed). During film-forming operation, bias voltage of 100 to 150 V was applied on the substrates so that the substrates were turned to negative potential with respect to the earth potential. The composition of metal elements in the formed film was determined by EPMA. Impurities elements other than metal elements in the film, nitrogen and carbon were determined. The content of oxygen was 1 atom % or less. The composition ratio of metal elements to nonmetallic elements is almost 1 to 1. Wear resistance was evaluated by the cutting test performed in the same procedure as in Example 1.

TABLE 5

| Experiment No. | Film composition (atomic ratio) M*[1] | | Al | Cr | V | C | N | Crystal structure*[2] | Value of expression(4) | Hardness (HV) | Worn width (μm) |
|---|---|---|---|---|---|---|---|---|---|---|---|
| 1 | | — | 0.75 | 0.15 | 0.1 | 0.1 | 0.9 | B | 1 | 3100 | 27.5 |
| 2 | | — | 0.75 | 0.15 | 0.1 | 0.3 | 0.7 | B | 1 | 3020 | 31.4 |
| 3 | | — | 0.75 | 0.15 | 0.1 | 0.4 | 0.6 | B | 1 | 3010 | 31.9 |
| 4 | | — | 0.75 | 0.15 | 0.1 | 0.6 | 0.4 | B | 1 | 2750 | 50.1 |
| 5 | 0.1 | Ti, Nb | 0.7 | 0.1 | 0.1 | 0.1 | 0.9 | B | 1 | 3150 | 25.4 |
| 6 | 0.1 | Ti, Nb | 0.7 | 0.1 | 0.1 | 0.3 | 0.7 | B | 1 | 3040 | 30.3 |
| 7 | 0.1 | Ti, Nb | 0.7 | 0.1 | 0.1 | 0.4 | 0.6 | B | 1 | 2950 | 35.3 |
| 8 | 0.1 | Ti, Nb | 0.7 | 0.1 | 0.1 | 0.6 | 0.4 | B | 1 | 2750 | 50.1 |
| 9 | 0.1 | Ti | 0.7 | 0.1 | 0.1 | 0.1 | 0.9 | B | 1 | 3100 | 27.5 |
| 10 | 0.1 | Ti | 0.7 | 0.1 | 0.1 | 0.3 | 0.7 | B | 1 | 3050 | 29.8 |
| 11 | 0.1 | Ti | 0.7 | 0.1 | 0.1 | 0.4 | 0.6 | B | 1 | 2950 | 35.3 |
| 12 | 0.1 | Ti | 0.7 | 0.1 | 0.1 | 0.6 | 0.4 | B | 1 | 2700 | 54.9 |

*[1]When many elements are added, atomic ratio of each element is determined by equipartition of adding amounts of M elements.
*[2]B represents rock salt structure, and H represents ZnS structure.

From FIG. 5, it is evident that the end mill of each of the Experiments Nos. 1–3, 5–7 and 9–11 with the film satisfying the requirements of the present invention coated on it provided the better results compared with the end mills of Experiments Nos. 4, 8, and 12, which showed composition ratio of C and N in the film out of the range defined by the present invention. The results of the cutting test revealed that the worn width was smaller and wear resistance was good.

Example 4

A target alloy comprising Ti, V and Al was attached on a cathode of an AIP apparatus shown in FIG. 1. Further, a cemented carbide tip and a cemented carbide end mill (10 mm in diameter; with 4 edges) were attached on the holder as objects to be processed, and the space inside the chamber was turned to vacuum condition. Then, the temperature of the objects to be processed was heated up to 500° C. by a heater in the chamber. Mixed gas of nitrogen and methane was introduced, and the pressure in the chamber was set to 2.66 Pa. Arc discharge was started, and a film of (TiAlV)(CN) of 3 μm in thickness was formed on the surface of each of the objects to be processed. During film-forming operation, bias voltage of 100 V was applied on the substrates (objects to be processed) so that the substrates were turned to negative potential with respect to the earth potential. Compositions of Ti, V, and Al in the formed film were determined by EPMA. Impurities elements other than the metal elements (Ti,V,Al) in the film and nitrogen and carbon were determined. The content of oxygen was 1 atom % or less. The composition ratio of metal elements to nonmetallic elements in almost 1 to 1. Wear resistance was evaluated by the cutting test in the same procedure as in Example 2.

TABLE 6

| Experiment No. | Film composition (atomic ratio) Ti | Al | V | C | N | Crystal structure* | Value of expression (4) | Hardness (HV) | Worn width (μm) |
|---|---|---|---|---|---|---|---|---|---|
| 1 | 0.11 | 0.74 | 0.15 | 0.1 | 0.9 | B | 1 | 3450 | 16.1 |
| 2 | 0.11 | 0.74 | 0.15 | 0.3 | 0.7 | B | 1 | 3400 | 17.3 |
| 3 | 0.11 | 0.74 | 0.15 | 0.4 | 0.6 | B | 1 | 3300 | 20.1 |
| 4 | 0.11 | 0.74 | 0.15 | 0.6 | 0.4 | B | 1 | 2800 | 32.4 |

*B represents rock salt structure.

From Table 6, it is evident that the end mills in Experiments Nos. 1 to 3 with the film satisfying the requirements of the present invention coated on it showed the better results in the cutting test compared with the end mill of No.4, which was out of the range defined by the present invention in the ratios of C and N in (TiAlV)(CN) film. That is, the end mills of Nos. 1 to 3 showed smaller worn width and higher wear resistance.

Example 5

A TiAlVN film with composition (Ti: 0.15 atomic ratio; V: 0.15 atomic ratio and Al: 0.7 atomic ratio) and having different crystal orientation was used. Bias voltage applied on the substrate was changed in the range of 50 V to 200 V, film-forming temperature (temperature of the object to be processed) was changed in the range of 300° C. to 700° C., and film-forming pressure was changed in the range of 1 Pa to 5.2 Pa. By the same procedure as in Example 1, film was formed on a cemented carbide end mill (10 mm in diameter; with 4 edges). In this case, an evaporating source shown in FIG. 3 was used. After film formation, crystal structure, crystal orientation, Vickers hardness and the worn width in the cutting test were determined. The crystal orientation and crystal structure of the formed film were determined by X-ray diffraction. Wear resistance of the end mill after film formation was evaluated by the cutting test performed in the same procedure as in Example 2. The results are summarized in Table 7.

TABLE 7

| Experiment No. | Film composition (atomic ratio) Ti | Al | V | C | N | Crystal structure* | I(111)/I(220) | I(200)/I(220) | I(200)/I(111) | Hardness (HV) | Worn width (μm) |
|---|---|---|---|---|---|---|---|---|---|---|---|
| 1 | 0.11 | 0.74 | 0.15 | 0 | 1 | B | 2 | 13 | 6.50 | 3500 | 15.0 |
| 2 | 0.11 | 0.74 | 0.15 | 0 | 1 | B | 3 | 4.5 | 1.50 | 3400 | 17.3 |
| 3 | 0.11 | 0.74 | 0.15 | 0 | 1 | B | 2 | 2.4 | 1.20 | 3300 | 20.1 |
| 4 | 0.11 | 0.74 | 0.15 | 0 | 1 | B | 1 | 0.8 | 0.80 | 3100 | 27.5 |
| 5 | 0.11 | 0.74 | 0.15 | 0 | 1 | B | 3 | 1 | 0.33 | 3050 | 29.8 |
| 6 | 0.11 | 0.74 | 0.15 | 0 | 1 | B | 0.6 | 0.1 | 0.17 | 2800 | 38.4 |

*B represents rock salt structure.

From Table 7, it is evident that the experiment specimens Nos. 1 to 5 having the preferred crystal orientation as defined in the present invention showed smaller worn width and the higher wear resistance compared with the experiment specimen No. 6. This demonstrates that a hard film with better wear resistance can be prepared by controlling crystal orientation to satisfy the requirements of the present invention.

Example 6

The film satisfying the requirements of the present invention as shown in the film 1 and the film 2 in Tables 8 to 10 as well as laminated films of various types of metal nitride, metal carbide, metal carbide-nitride or metal film were formed on a cemented carbide end mill (10 mm in diameter; with 2 edges). To laminate the films, on the cemented carbide end mill, films were laminated alternately with thickness shown in Tables 8 to 10 in the order of the film 1 in Tables 8 to 10 and the film 2 in Tables 7 to 9. The number of laminated layers shown in Tables 8 to 10 is the number of repeated laminations when [film 1+film 2] is defined as one unit. Wear resistance of the film was evaluated by the cutting test performed in the same procedure as in Example 1. These results are summarized in Tables 8 to 10.

TABLE 8

| Experiment No. | Film-1* | Thickness of film-1 (μm) | Film-2* | Thickness of film-2 (μm) | Number of layers | Worn width (μm) |
|---|---|---|---|---|---|---|
| 1 | $Ti(C_{0.5}N_{0.5})$ | 0.05 | AlCrVN | 0.05 | 30 | 31 |
| 2 | TiC | 0.5 | AlCrVN | 2.5 | 1 | 33 |
| 3 | $Ti_{0.5}Al_{0.5}N$ | 0.5 | AlCrVN | 2.5 | 1 | 32 |
| 4 | $Ti_{0.5}Al_{05}N$ | 0.05 | AlCrVN | 0.05 | 30 | 34 |
| 5 | $Ti_{0.5}Al_{0.5}N$ | 0.005 | AlCrVN | 0.005 | 300 | 33 |
| 6 | TiN | 0.5 | AlCrVN | 2.5 | 1 | 34 |
| 7 | TiN | 0.05 | AlCrVN | 0.05 | 30 | 35 |
| 8 | TiN | 0.005 | AlCrVN | 0.005 | 300 | 34 |
| 9 | $T_{0.5}Al_{0.5}$ | 0.01 | AlCrVN | 3 | 1 | 35 |
| 10 | Ti | 0.1 | AlCrVN | 3 | 1 | 34 |
| 11 | Cr | 1 | AlCrVN | 2 | 1 | 37 |
| 12 | AlCrVN | 1.5 | $Al_{0.75}Cr_{0.13}V_{0.12}N$ | 1.5 | 1 | 37 |
| 13 | AlCrVN | 0.05 | $Al_{0.77}Cr_{0.11}V_{0.12}N$ | 0.05 | 30 | 34 |
| 14 | AlCrVN | 0.005 | $Al_{0.77}Cr_{0.11}V_{0.12}N$ | 0.005 | 300 | 33 |

*AlCrVN (Al:Cr:V = 0.75:0.15:0.1)

TABLE 9

| Experiment No. | Film-1* | Thickness of film-1 (μ) | Film-2* | Thickness of film-2 (μ) | Number of layers | Worn width (μm) |
|---|---|---|---|---|---|---|
| 15 | $Ti(C_{0.5}N_{0.s})$ | 0.05 | TiTaAlCrVN | 0.05 | 30 | 30 |
| 16 | TiC | 0.5 | TiTaAlCrVN | 2.5 | 1 | 32 |
| 17 | $Ti_{0.5}Al_{0.5}N$ | 0.5 | TiTaAlCrVN | 2.5 | 1 | 31 |
| 18 | $Ti_{0.5}Al_{0.5}N$ | 0.05 | TiTaAlCrVN | 0.05 | 30 | 33 |
| 19 | $Ti_{0.5}Al_{0.5}N$ | 0.005 | TiTaAlCrVN | 0.005 | 300 | 32 |
| 20 | TiN | 0.5 | TiTaAlCrVN | 2.5 | 1 | 33 |
| 21 | TiN | 0.05 | TiTaAlCrVN | 0.05 | 30 | 34 |
| 22 | TiN | 0.005 | TiTaAlCrVN | 0.005 | 300 | 33 |
| 23 | $Ti_{0.5}Al_{0.5}$ | 0.01 | TiTaAlCrVN | 3 | 1 | 34 |
| 24 | Ti | 0.1 | TiTaAlCrVN | 3 | 1 | 33 |
| 25 | Cr | 1 | TiTaAlCrVN | 2 | 1 | 36 |
| 26 | TiTaAlCrVN | 1.5 | $Ti_{0.03}Ta_{0.07}Al_{0.7}Cr_{0.08}V_{0.12}N$ | 1.5 | 1 | 36 |
| 27 | TiTaAlCrVN | 0.05 | $Ti_{0.04}Ta_{0.06}Al_{0.73}Cr_{0.07}V_{0.1}N$ | 0.05 | 30 | 33 |
| 28 | TiTaAlCrVN | 0.005 | $Ti_{0.04}Ta_{0.06}Al_{0.73}Cr_{0.07}V_{0.1}N$ | 0.005 | 300 | 32 |

*TiTaAlCrVN(Ti:Ta:Al:Cr:V = 0.05:0.05:0.7:0.1:0.1)

TABLE 10

| Experiment No. | Film-1* | Thickness of film-1 (μm) | Film-2* | Thickness of film-2 (μm) | Number of layers | Worn width (μm) |
|---|---|---|---|---|---|---|
| 29 | $Ti(C_{0.5}N_{0.5})$ | 0.05 | TiAlCrVN | 0.05 | 30 | 29 |
| 30 | TiC | 0.5 | TIAlCrVN | 2.5 | 1 | 31 |
| 31 | $Ti_{0.5}Al_{0.5}N$ | 0.5 | TiAlCrVN | 2.5 | 1 | 30 |
| 32 | $Ti_{0.5}Al_{0.5}N$ | 0.05 | TiAlCrVN | 0.05 | 30 | 32 |
| 33 | $Ti_{0.5}Al_{0.5}N$ | 0.005 | TiAlCrVN | 0.005 | 300 | 31 |
| 34 | TiN | 0.5 | TiAlCrVN | 2.5 | 1 | 32 |
| 35 | TiN | 0.05 | TiAlCrVN | 0.05 | 30 | 33 |
| 36 | TiN | 0.005 | TiAlCrVN | 0.005 | 300 | 32 |
| 37 | $Ti_{0.5}Al_{0.5}$ | 0.01 | TiAlCrVN | 3 | 1 | 33 |
| 38 | Ti | 0.1 | TiAlCrVN | 3 | 1 | 32 |
| 39 | Cr | 1 | TiAlCrVN | 2 | 1 | 35 |
| 40 | TiAlCrVN | 1.5 | $Ti_{0.1}Al_{0.7}Cr_{0.08}V_{0.12}N$ | 1.5 | 1 | 35 |
| 41 | TiAlCrVN | 0.05 | $Ti_{0.1}Al_{0.73}Cr_{0.07}V_{0.1}N$ | 0.05 | 30 | 32 |
| 42 | TiAlCrVN | 0.005 | $Ti_{0.1}Al_{0.73}Cr_{0.07}V_{0.1}N$ | 0.005 | 300 | 31 |

*TiAlCrVN(Ti:Al:Cr:V = 0.1:0.7:0.1:0.1)

From Experiments Nos. 1 to 42 in Tables 8 to 10, it is evident that good wear resistance can be provided with the worn width in the cutting test being less than 40 μm if the film satisfying the requirements of the present invention is coated even when two or more layers of the hard films are used for the cutting tools.

Example 7

A TiAlVN film with composition (Ti: 0.15 atomic ratio; V: 0.15 atomic ratio; Al: 0.7 atomic ratio) and laminated films comprising various types of metal nitride, metal carbide, metal carbide-nitride and metal film shown in Table 11 were formed on a cemented carbide end mill (10 mm in diameter; with 4 edges). The films were alternately laminated with thickness shown in Table 11 on the cemented carbide end mill in the order of the film 1 in Table 11 and the film 2 in Table 11. The number of laminated layers shown in Table 11 is the number of repeated laminations when [film 1+film 2] is defined as one unit. Wear resistance of the film was evaluated by the cutting test preformed in the same procedure as in Example 2. The results are shown in Table 11.

TABLE 11

| Experiment No. | Film-1* | Thickness of film-1 (μm) | Film-2* | Thickness of film-2 (μm) | Number of layers | Worn width (μm) |
|---|---|---|---|---|---|---|
| 1 | $Ti(C_{0.5}N_{0.5})$ | 0.05 | TiAlVN | 0.05 | 30 | 26 |
| 2 | TiC | 0.5 | TiAlVN | 2.5 | 1 | 25 |
| 3 | $Ti_{0.5}Al_{0.5}N$ | 0.5 | TiAlVN | 2.5 | 1 | 25 |
| 4 | $Ti_{0.5}Al_{0.5}N$ | 0.05 | TiAlVN | 0.05 | 30 | 27 |
| 5 | $Ti_{0.5}Al_{0.5}N$ | 0.005 | TiAlVN | 0.005 | 300 | 26 |
| 6 | TiN | 0.5 | TiAlVN | 2.5 | 1 | 26 |
| 7 | TiN | 0.05 | TiAlVN | 0.05 | 30 | 28 |
| 8 | TiN | 0.005 | TiAlVN | 0.005 | 300 | 26 |
| 9 | $Ti_{0.5}Al_{0.5}$ | 0.01 | TiAlVN | 3 | 1 | 27 |
| 10 | Ti | 0.1 | TiAlVN | 3 | 1 | 25 |
| 11 | Cr | 1 | TiAlVN | 2 | 1 | 27.5 |
| 12 | TiAlVN | 1.5 | $Ti_{0.08}Al_{0.74}V_{0.18}N$ | 1.5 | 1 | 25 |

TABLE 11-continued

| Experiment No. | Film-1* | Thickness of film-1 (μm) | Film-2* | Thickness of film-2 (μm) | Number of layers | Worn width (μm) |
|---|---|---|---|---|---|---|
| 13 | TiAlVN | 0.05 | $Ti_{0.1}Al_{0.75}V_{0.15}N$ | 0.05 | 30 | 26 |
| 14 | TiAlVN | 0.005 | $Ti_{0.1}Al_{075}V_{015}N$ | 0.005 | 300 | 25 |

*TiAlVN(Ti:Al:V = 0.15:0.7:0.15)

From Experiments Nos. 1 to 14 in Table 11, it is evident that good wear resistance can be provided with the worn width of less than 30 μm in the cutting test when the film satisfying the requirements of the present invention was coated even in case two or more layers of the hard films for cutting tools were used.

Example 8

A nitride film with composition (Al: 0.75 atomic ratio; Cr: 0.15 atomic ratio; V: 0.1 atomic ratio) or a nitride film with composition (Ti: 0.05 atomic ratio; Ta: 0.05 atomic ratio; Al: 0.7 atomic ratio; Cr: 0.1 atomic ratio; V: 0.1 atomic ratio), or a nitride film with composition (Ti: 0.1 atomic ratio; Al: 0.7 atomic ratio; Cr: 0.1 atomic ratio; V: 0.1 atomic ratio) were formed on a cemented carbide tip or a cemented carbide end mill (10 mm in diameter; with 2 edges). Bias voltage applied on the substrate was changed in the range of 30 V to 400 V, the temperature of the substrate (object to be processed) was changed in the range of 300° C. to 1000° C., and the pressure of nitrogen gas was changed in the range of 0.3 Pa to 7 Pa. Vickers hardness of the film was determined, and the cutting test was performed in the same procedure as in Example 1, and wear resistance was evaluated. These results and the experimental conditions are shown in Table 12 for the (Al,Cr,V)N film, in Table 13 for the (Ti,Ta,Al,Cr,V)N film, and in Table 14 for the (Ti,Al,Cr,V)N film.

TABLE 12

| Experiment No.*1 | Bias voltage (V) | Substrate temperature (° C.) | Reactive gas pressure (Pa) | Crystal structure*2 | Hardness (HV) | Worn width (μm) |
|---|---|---|---|---|---|---|
| 1 | 30 | 500 | 2.66 | H + B | 2700 | 54.9 |
| 2 | 100 | 500 | 2.66 | B | 2900 | 38.4 |
| 3 | 150 | 500 | 2.66 | B | 3100 | 27.5 |
| 4 | 200 | 500 | 2.66 | B | 3100 | 27.5 |
| 5 | 400 | 500 | 2.66 | No film-forming | — | — |
| 6 | 100 | 250 | 2.66 | Film peeled off | — | — |
| 7 | 100 | 450 | 2.66 | B | 3200 | 23.5 |
| 8 | 100 | 550 | 2.66 | B | 3150 | 25.4 |
| 9 | 100 | 650 | 2.66 | B + H | 3100 | 27.5 |
| 10 | 100 | 750 | 2.66 | B + H | 3050 | 29.8 |
| 11 | 100 | 1000 | 2.66 | B + H | 2850 | 41.9 |
| 12 | 150 | 600 | 0.3 | B | 2650 | 60.3 |
| 13 | 150 | 600 | 1.33 | B | 2950 | 35.3 |
| 14 | 150 | 600 | 5.2 | B | 2900 | 38.4 |
| 15 | 150 | 600 | 7 | B | 2900 | Excessively thin film |

*1Films of Nos. 1–15 are (Al, Cr, V)N films.
*2B represents rock salt structure, and H represents ZnS structure.

TABLE 13

| Experiment No.*1 | Bias voltage (V) | Substrate temperature (° C.) | Reactive gas pressure (Pa) | Crystal structure*2 | Hardness (HV) | Worn width (μm) |
|---|---|---|---|---|---|---|
| 16 | 30 | 500 | 2.66 | H + B | 2750 | 50.1 |
| 17 | 100 | 500 | 2.66 | B | 2950 | 35.3 |
| 18 | 150 | 500 | 2.66 | B | 3100 | 27.5 |
| 19 | 200 | 500 | 2.66 | B | 3100 | 27.5 |
| 20 | 400 | 500 | 2.66 | No film-forming | — | — |
| 21 | 100 | 250 | 2.66 | Film peeled off | — | — |
| 22 | 100 | 450 | 2.66 | B | 3100 | 27.5 |
| 23 | 100 | 550 | 2.66 | B | 3100 | 27.5 |
| 24 | 100 | 650 | 2.66 | B + H | 3050 | 29.8 |
| 25 | 100 | 750 | 2.66 | B + H | 3000 | 32.4 |
| 26 | 100 | 1000 | 2.66 | B + H | 2800 | 45.8 |
| 27 | 150 | 600 | 0.3 | B | 2600 | 66.3 |
| 28 | 150 | 600 | 1.33 | B | 3000 | 32.4 |
| 29 | 150 | 600 | 5.2 | B | 2960 | 34.7 |

TABLE 13-continued

| Experiment No.*1 | Bias voltage (V) | Substrate temperature (° C.) | Reactive gas pressure (Pa) | Crystal structure*2 | Hardness (HV) | Worn width (μm) |
|---|---|---|---|---|---|---|
| 30 | 150 | 600 | 7 | B | 2900 | Excessively thin film |

*1Films of Nos. 16–30 are (Ti, Ta, Al, Cr, V)N films.
*2B represents rock salt structure, and H represents ZnS structure.

TABLE 14

| Experiment No.*1 | Bias voltage (V) | Substrate temperature (° C.) | Reactive gas pressure (Pa) | Crystal structure*2 | Hardness (HV) | Worn width (μm) |
|---|---|---|---|---|---|---|
| 31 | 30 | 500 | 2.66 | H + B | 2600 | 66.3 |
| 32 | 100 | 500 | 2.66 | B | 3100 | 27.5 |
| 33 | 150 | 500 | 2.66 | B | 3100 | 27.5 |
| 34 | 200 | 500 | 2.66 | B | 3050 | 29.8 |
| 35 | 400 | 500 | 2.66 | No film-forming | — | — |
| 36 | 100 | 250 | 2.66 | Film peeled off | — | — |
| 37 | 100 | 450 | 2.66 | B | 3200 | 23.5 |
| 38 | 100 | 550 | 2.66 | B | 3100 | 27.5 |
| 39 | 100 | 650 | 2.66 | B + H | 3050 | 29.8 |
| 40 | 100 | 750 | 2.66 | B + H | 3000 | 32.4 |
| 41 | 100 | 1000 | 2.66 | B + H | 2800 | 45.8 |
| 42 | 150 | 600 | 0.3 | B | 2670 | 58.1 |
| 43 | 150 | 600 | 1.33 | B | 3100 | 27.5 |
| 44 | 50 | 600 | 5.2 | B | 3050 | 29.8 |
| 45 | 150 | 600 | 7 | B | 2950 | Excessive thin film |

*1Films Nos. 31–45 are (Ti, Al, Cr, V)N films.
*2B represents rock salt structure, and H represents ZnS structure.

From Tables 12 to 14, it is evident that Experiments Nos. 2–4, 7–10, 13, 14, 17–19, 22–25, 28, 29, 32–34, 37–40, 43 and 44 satisfying the requirements of the present invention provide the film with higher hardness and smaller worn width in the cutting test compared with Nos. 1, 5, 6, 11, 12, 15, 16, 20, 21, 26, 27, 30, 31, 35, 36, 41, 42, and 45. This shows that, for the purpose of attaining good wear resistance, it is preferable to set bias voltage on the substrate, substrate temperature, and pressure of reactive gas (partial pressure or total pressure) within the ranges as defined in the present invention.

Example 9

A TiAlVN film with composition (Ti: 0.15 atomic ratio; V: 0.15 atomic ratio; Al: 0.7 atomic ratio) was formed on a cemented carbide tip and a cemented carbide end mill (10 mm in diameter; with 4 edges) under the condition that bias voltage applied on the substrate was changed in the range of 30 V to 400 V, temperature of the substrate (object to be processed) was changed in the range of 250° C. to 1000° C., and pressure of nitrogen gas was changed in the range of 0.3 Pa to 7 Pa. Vickers hardness of the obtained film was determined, and the cutting test was performed in the same procedure as in Example 2, and wear resistance was evaluated. The results are shown in Table 15.

TABLE 15

| Experiment No. | Bias voltage (V) | Substrate temperature (° C.) | Reactive gas pressure (Pa) | Crystal structure* | Hardness (HV) | Worn width (μm) |
|---|---|---|---|---|---|---|
| 1 | 30 | 500 | 2.66 | H + B | 2800 | 35.3 |
| 2 | 100 | 500 | 2.66 | B | 3500 | 15.0 |
| 3 | 150 | 500 | 2.66 | B | 3400 | 17.3 |
| 4 | 200 | 500 | 2.66 | B | 3300 | 20.1 |
| 5 | 400 | 500 | 2.66 | No film-forming | — | — |
| 6 | 100 | 250 | 2.66 | Film peeled off | — | — |
| 7 | 100 | 450 | 2.66 | B | 3400 | 17.3 |
| 8 | 100 | 550 | 2.66 | B | 3450 | 16.1 |
| 9 | 100 | 650 | 2.66 | B + H | 3350 | 18.7 |
| 10 | 100 | 850 | 2.66 | B + H | 3050 | 29.8 |
| 11 | 100 | 1000 | 2.66 | B + H | 2850 | 32.4 |
| 12 | 100 | 600 | 0.3 | B | 2750 | 50.1 |

TABLE 15-continued

| Experiment No. | Bias voltage (V) | Substrate temperature (° C.) | Reactive gas pressure (Pa) | Crystal structure* | Hardness (HV) | Worn width (μm) |
|---|---|---|---|---|---|---|
| 13 | 100 | 600 | 1.33 | B | 3200 | 23.5 |
| 14 | 100 | 600 | 5.2 | B | 3300 | 20.1 |
| 15 | 100 | 600 | 7 | B | 3250 | Excessively thin film |

*B represents rock salt structure, and H represents ZnS structure.

From Table 15, it is apparent that Experiments Nos. 2–4, 7–9, 13 and 14 provide the film with higher hardness and smaller worn width in the cutting test compared with Experiments Nos. 1, 5, 6, 10–12, and 15. This demonstrates that, for the purpose of obtaining a film with high wear resistance, it is preferable to set the bias voltage on the substrate, the substrate temperature and the pressure of reactive gas (partial pressure or total pressure) within the ranges defined in the present invention.

Example 10

Study was performed on the influence of relative density of the target and contents of impurities on discharge condition during film-forming operation.

Ti powder, Nb powder, Cr powder, V powder or Al powder of 100-mesh or lower were mixed in a given amount. HIP processing was performed at temperature of 500° C. and under pressure of $8\times10^7$ Pa, and the targets with compositions as shown in Tables 16 to 18 were prepared. The compositions of the targets were determined by ICP-MS. To determine discharge characteristics of the targets thus obtained, each target formed in 254 mm in outer diameter and 5 mm in thickness was attached on a sputtering apparatus. By reactive pulse sputtering method, a film of 3 μm in thickness was formed on a cemented carbide tip. Film formation was performed using $N_2$ gas as reactive gas and with output of 500 W.

The composition of the hard film obtained was determined by APS. Wear resistance was evaluated by the cutting test performed in the same procedure as in Example 1 in accordance with the following criteria. For the discharge condition during film-forming operation, discharge condition on the surface was visually inspected and discharge voltage was monitored. The results are summarized in Tables 16 to 18.

Evaluation criteria for the cutting test:

○: Wearing amount is less than 40 μm x: Wearing amount is 40 μm or more

Evaluation criteria for discharge condition:

Stable: Instantaneous increase of discharge voltage or local deviation of discharge is not recognized.

Slightly unstable: Instantaneous increase of discharge voltage or local deviation of discharge is recognized in slight extent.

Unstable: Instantaneous increase of discharge voltage or local deviation of discharge is recognized in considerable extent.

Discharge interruption: Discharge is stopped.

TABLE 16

| Experiment No. | Target composition (atomic ratio) | | | Relative density | Presence/size of defects and voids | State of discharge | Film composition (atomic ratio) | | | Wear resistance |
|---|---|---|---|---|---|---|---|---|---|---|
| | Al | Cr | V | | | | Al | Cr | V | |
| 1 | 0.55 | 0.2 | 0.25 | 99.8 | <0.3 mm | Stable | 0.53 | 0.21 | 0.26 | ○ |
| 2 | 0.65 | 0.2 | 0.15 | 99.5 | <0.3 mm | Stable | 0.63 | 0.21 | 0.16 | ○ |
| 3 | 0.75 | 0.1 | 0.15 | 99 | <0.3 mm | Stable | 0.73 | 0.11 | 0.16 | ○ |
| 4 | 0.55 | 0.2 | 0.25 | 97 | <0.3 mm | Stable | 0.53 | 0.21 | 0.26 | ○ |
| 5 | 0.65 | 0.2 | 0.15 | 96 | <0.3 mm | Stable | 0.63 | 0.21 | 0.16 | ○ |
| 6 | 0.75 | 0.1 | 0.15 | 94 | Voids not smaller than 3 mm | Unstable | 0.73 | 0.11 | 0.16 | x |
| 7 | 0.55 | 0.2 | 0.25 | 93 | Voids not smaller than 3 mm | Unstable | 0.53 | 0.21 | 0.26 | x |
| 8 | 0.65 | 0.2 | 0.15 | 94 | <0.3 mm | Unstable | 0.63 | 0.21 | 0.16 | x |
| 9 | 0.75 | 0.1 | 0.15 | 90 | Voids not smaller than 3 mm | Interrupted | 0.73 | 0.11 | 0.16 | Not measurable |

TABLE 17

| Experiment No. | Target composition (atomic ratio) | | | | | Relative density | Presence/size of defects and voids | State of discharge | Film composition (atomic ratio) | | | | Wear resistance |
|---|---|---|---|---|---|---|---|---|---|---|---|---|---|
| | M* | | Al | Cr | V | | | | M | Al | Cr | V | |
| 10 | 0.1 | Ti, Nb | 0.55 | 0.15 | 0.2 | 99.8 | <0.3 mm | Stable | 0.1 | 0.53 | 0.16 | 0.21 | ○ |
| 11 | 0.2 | Ti, Ta, Nb | 0.55 | 0.1 | 0.15 | 99.5 | <0.3 mm | Stable | 0.2 | 0.53 | 0.11 | 0.16 | ○ |
| 12 | 0.25 | Nb, Ta | 0.67 | 0.05 | 0.03 | 99 | <0.3 mm | Stable | 0.25 | 0.65 | 0.06 | 0.04 | ○ |
| 13 | 0.14 | Ti, Mo | 0.63 | 0.11 | 0.12 | 97 | <0.3 mm | Stable | 0.14 | 0.61 | 0.12 | 0.13 | ○ |

TABLE 17-continued

| Experiment No. | Target composition (atomic ratio) M* | | Al | Cr | V | Relative density | Presence/size of defects and voids | State of discharge | Film composition (atomic ratio) M | Al | Cr | V | Wear resistance |
|---|---|---|---|---|---|---|---|---|---|---|---|---|---|
| 14 | 0.07 | Nb, Mo | 0.7 | 0.12 | 0.11 | 96 | <0.3 mm | Stable | 0.07 | 0.68 | 0.13 | 0.12 | ○ |
| 15 | 0.1 | Ti, Ta | 0.76 | 0.07 | 0.07 | 94 | Voids not smaller than 3 mm | Unstable | 0.1 | 0.74 | 0.08 | 0.08 | x |
| 16 | 0.1 | Ti, Nb | 0.7 | 0.1 | 0.1 | 93 | Voids not smaller than 3 mm | Unstable | 0.1 | 0.68 | 0.11 | 0.11 | x |
| 17 | 0.28 | Ti, Nb | 0.65 | 0 | 0.07 | 94 | <0.3 mm | Unstable | 0.28 | 0.63 | 0.01 | 0.08 | x |
| 18 | 0.28 | Ti, Ta | 0.65 | 0.07 | 0 | 90 | Voids not smaller than 3 mm | Interrupted | 0.28 | 0.63 | 0.08 | 0.01 | Not measurable |

*When many elements are added, atomic ratio of each element is determined by equipartition of adding amounts of M elements.

TABLE 18

| Experiment No. | Target composition (atomic ratio) Ti | Al | Cr | V | Relative density | Presence/size of defects and voids | State of discharge | Film composition (atomic ratio) Ti | Al | Cr | V | Wear resistance |
|---|---|---|---|---|---|---|---|---|---|---|---|---|
| 19 | 0.1 | 0.55 | 0.15 | 0.2 | 99.8 | <0.3 mm | Stable | 0.1 | 0.53 | 0.16 | 0.21 | ○ |
| 20 | 0.2 | 0.55 | 0.1 | 0.15 | 99.5 | <0.3 mm | Stable | 0.2 | 0.53 | 0.11 | 0.16 | ○ |
| 21 | 0.25 | 0.67 | 0.05 | 0.03 | 99 | <0.3 mm | Stable | 0.25 | 0.65 | 0.06 | 0.04 | ○ |
| 2 | 0.14 | 0.63 | 0.11 | 0.12 | 97 | <0.3 mm | Stable | 0.14 | 0.61 | 0.12 | 0.13 | ○ |
| 23 | 0.07 | 0.7 | 0.12 | 0.11 | 96 | <0.3 mm | Stable | 0.07 | 0.68 | 0.13 | 0.12 | ○ |
| 24 | 0.1 | 0.76 | 0.07 | 0.07 | 94 | Voids not smaller than 3 mm | Unstable | 0.13 | 0.66 | 0.08 | 0.13 | x |
| 25 | 0.1 | 0.7 | 0.1 | 0.1 | 93 | Voids not smaller than 3 mm | Unstable | 0.13 | 0.6 | 0.11 | 0.16 | x |
| 26 | 0.25 | 0.67 | 0.05 | 0.03 | 94 | <0.3 mm | Unstable | 0.28 | 0.57 | 0.06 | 0.09 | x |
| 27 | 0.14 | 0.63 | 0.11 | 0.12 | 90 | Voids not smaller than 3 mm | Interrupted | 0.17 | 0.53 | 0.12 | 0.18 | Not measurable |

From Tables 16 to 18, it is apparent that Nos. 1–5, 10–14, and 19–23 satisfied relative density as defined in the present invention and discharge condition was satisfactory, and that targets and the compositions were almost the same and the film was obtained which had the same compositions as those of the targets and which exhibit good wear resistance. In contrast, Nos. 6–9, 15–18, and 24–27 did not satisfy the requirements of the present invention. Therefore, discharge condition was unstable or discharge could not be continued. As a result, the compositions of the formed films extensively differed from those of the targets and the films with poor wear resistance were obtained.

Example 11

Study was performed on the influence of relative density of the target and on the contents of impurities on the discharge condition during film-forming operation.

Ti powder, V powder and Al powder of 100-mesh or lower were mixed in a given amount, and HIP processing was performed, and the targets with the compositions shown in Table 19 were prepared under the temperature of 500° C., and pressure of $8\times10^7$ Pa. The compositions of the targets were determined by ICP-MS. To determine discharge characteristics of the targets thus obtained, each target formed in 254 mm in outer diameter and 5 mm in thickness was attached on a sputtering apparatus. By reactive pulse sputtering method, a film of 3 μm in thickness was formed on a cemented carbide tip. Then, film-forming operation was carried out using $N_2$ gas as reactive gas with output of 500 W.

The compositions of the hard films thus obtained were determined by XPS. Wear resistance was evaluated by the cutting test performed in the same procedure as in Example 2 and it was evaluated in accordance with the evaluation criteria given below. For the discharge condition during film-forming operation, discharge condition on the surface was visually inspected or discharge voltage was monitored. The results are shown in Table 19.

Evaluation criteria for the cutting test:

○: Wearing amount is less than 30 μm x: Wearing amount is 30 μm or more

Evaluation criteria for discharge condition:

Stable: Instantaneous increase of discharge voltage or local deviation of discharge is not recognized.

Slightly unstable: Instantaneous increase of discharge voltage or local deviation of discharge is recognized in slight extent.

Unstable: Instantaneous increase of discharge voltage or local deviation of discharge is recognized in considerable extent.

Discharge interruption: Discharge is stopped.

TABLE 19

| Experi-ment No. | Target composition (atomic ratio) Ti | Al | V | Relative density (%) | Presence/size of defects and voids | State of discharge | Film composition (atomic ratio) Ti | Al | V | Wear resistance |
|---|---|---|---|---|---|---|---|---|---|---|
| 1 | 0.25 | 0.55 | 0.2 | 99.8 | <0.3 mm | Stable | 0.26 | 0.53 | 0.21 | ○ |
| 2 | 0.15 | 0.55 | 0.3 | 99.5 | <0.3 mm | Stable | 0.16 | 0.53 | 0.31 | ○ |
| 3 | 0.15 | 0.65 | 0.2 | 99 | <0.3 mm | Stable | 0.16 | 0.63 | 0.21 | ○ |
| 4 | 0.1 | 0.65 | 0.25 | 97 | <0.3 mm | Stable | 0.11 | 0.63 | 0.26 | ○ |
| 5 | 0.15 | 0.78 | 0.07 | 96 | <0.3 mm | Stable | 0.16 | 0.76 | 0.08 | ○ |
| 6 | 0.25 | 0.55 | 0.2 | 94 | Void not smaller than 3 mm | Unstable | 0.29 | 0.45 | 0.26 | x |
| 7 | 0.15 | 0.55 | 0.3 | 93 | Void not smaller than 3 mm | Unstable | 0.19 | 0.45 | 0.36 | x |
| 8 | 0.07 | 0.78 | 0.15 | 94 | <0.3 mm | Unstable | 0.11 | 0.68 | 0.21 | x |
| 9 | 0.15 | 0.7 | 0.15 | 90 | Void not smaller than 3 mm | Interrupted | 0.19 | 0.6 | 0.21 | Not measurable |

From Table 19, it is apparent that Nos. 1–5 satisfied relative density as defined in the present invention and discharge condition was satisfactory, and that targets and the compositions are almost the same and the film was obtained which have the same compositions as those of the targets and which exhibit good wear resistance. In contrast, Nos. 6–9 did not satisfy the requirements of the present invention. Therefore, discharge condition was unstable or discharge cannot be continued. As a result, the compositions of the formed films extensively differed from those of the targets and the films with poor wear resistance were obtained.

Example 12

Next, evaluation was made on the influence of the contents of impurities (oxygen, hydrogen, chlorine, copper and magnesium) in the target on the discharge condition during film-forming operation.

The targets with the compositions shown in Table 20 were prepared by the same procedure as in Example 10. Relative density of each of the targets obtained was 99% or more. There was no sign suggesting the presence of void of 0.3 mm or more and continuous defects. Using the targets thus obtained, film was formed with nitrogen as the film-forming gas on an AIP apparatus used in the Example 1. The contents of impurities in the targets were determined by ICP-MS. Discharge conditions during film-forming operation were evaluated by the same procedure as in Example 10. The results are summarized in Table 20.

TABLE 20

| Experiment No. | Target composition (mass %) M* | | Al | Cr | V | 0 | H | Cl | Cu | Mg | Discharge characteristics |
|---|---|---|---|---|---|---|---|---|---|---|---|
| 1 | 12.69 | Ti | 39.30 | 20.66 | 26.98 | 0.28 | 0.02 | 0.03 | 0.03 | 0.01 | Stable |
| 2 | 25.56 | Ti | 39.60 | 13.88 | 20.39 | 0.31 | 0.03 | 0.17 | 0.04 | 0.02 | Slightly unstable |
| 3 | 34.95 | Ti | 52.75 | 7.59 | 4.46 | 0.07 | 0.01 | 0.14 | 0.01 | 0.02 | Stable |
| 4 | 18.79 | Ti | 47.64 | 16.03 | 17.13 | 0.22 | 0.05 | 0.08 | 0.03 | 0.03 | Stable |
| 5 | 9.82 | Ti | 55.30 | 18.27 | 16.41 | 0.10 | 0.03 | 0.04 | 0.03 | 0.01 | Stable |
| 6 | 14.67 | Ti | 62.78 | 11.14 | 10.92 | 0.26 | 0.02 | 0.15 | 0.05 | 0.01 | Stable |
| 7 | 14.03 | Ti | 55.33 | 15.23 | 14.92 | 0.28 | 0.04 | 0.12 | 0.02 | 0.02 | Stable |
| 8 | — | — | 38.98 | 27.31 | 33.45 | 0.14 | 0.04 | 0.03 | 0.04 | 0.01 | Stable |
| 9 | — | — | 49.06 | 29.09 | 21.37 | 0.23 | 0.01 | 0.19 | 0.03 | 0.02 | Stable |
| 10 | — | — | 60.87 | 15.64 | 22.99 | 0.33 | 0.02 | 0.13 | 0.01 | 0.01 | Slightly unstable |
| 11 | 17.53 | Ti, Nb | 36.94 | 19.42 | 25.36 | 0.52 | 0.03 | 0.14 | 0.04 | 0.02 | Slightly unstable |
| 12 | 33.59 | Ti, Nb | 35.40 | 12.41 | 18.23 | 0.16 | 0.07 | 0.10 | 0.03 | 0.01 | Slightly unstable |
| 13 | 43.97 | Ti, Nb | 45.16 | 6.49 | 3.82 | 0.24 | 0.01 | 0.28 | 0.01 | 0.02 | Slightly unstable |
| 14 | 25.36 | Ti, Nb | 43.73 | 14.72 | 15.73 | 0.30 | 0.03 | 0.06 | 0.07 | 0,01 | Slightly unstable |
| 15 | 13.75 | Ti, Nb | 52.71 | 17.41 | 15.64 | 0.28 | 0.02 | 0.13 | 0.02 | 0.04 | Slightly unstable |
| 16 | 29.16 | Ti, Ta | 52.26 | 9.28 | 9.09 | 0.10 | 0.04 | 0.03 | 0.03 | 0.02 | Stable |
| 17 | 28.03 | Ti, Ta | 46.27 | 12.74 | 12.48 | 0.25 | 0.01 | 0.17 | 0.04 | 0.01 | Stable |
| 18 | 59.71 | Ti, Ta | 32.68 | 0.00 | 6.65 | 0.66 | 0.03 | 0.18 | 0.03 | 0.06 | Slightly unstable |
| 19 | 59.80 | Ti, Ta | 32.73 | 6.79 | 0.00 | 0.27 | 0.04 | 0.22 | 0.08 | 0.07 | Sightly unstable |

*When many elements are added, atomic ratio of each element is determined by equipartition of adding amounts of M elements.

From Table 20, it is apparent that the contents of all impurities of oxygen, hydrogen, chlorine, copper and magnesium) in Nos. 1, 3–9, 16 and 17 satisfy the requirements of the present invention and discharge conditions were satisfactory. In contrast, in Experiments Nos. 2, 10 and 11, the following contents of impurities were out of the range defined as preferable in the present invention: oxygen content in Nos. 2, 10 and 11, hydrogen content in No. 12, chlorine content in No. 13, copper content in No. 14, magnesium content in NO. 15, oxygen and magnesium contents in No. 18, and chlorine, copper, and magnesium contents in No. 19. These results suggest that, for the purpose of attaining good discharge conditions during film-forming operation and of obtaining the hard wear resistant film of the present invention, which exhibits good and efficient discharge condition during film-forming operation, it is preferable to set the contents of the impurities (oxygen, hydrogen, chlorine, copper, and magnesium) in the targets within the range as defined in the present invention.

Example 13

Next, evaluation was made on the influence of the contents of impurities (oxygen, hydrogen, chlorine, copper and magnesium) in the target on the discharge condition during film-forming operation.

The targets with the compositions shown in Table 21 were prepared by the same procedure as in Example 11. Relative density of each of the targets obtained was 99% or more. There was no sign suggesting the presence of void of 0.3 mm or more and continuous defects. Using the targets thus obtained, film was formed with nitrogen as the film-forming gas on an AIP apparatus used in the Example 1. The contents of impurities in the targets were determined by ICP-MS. Discharge conditions during film-forming operation were evaluated by the same procedure as in Example 11. The results are summarized in Table 21.

TABLE 21

| Experiment | Target composition (mass %) | | | | | | | | Discharge |
|---|---|---|---|---|---|---|---|---|---|
| No. | Ti | Al | V | 0 | H | Cl | Cu | Mg | characteristics |
| 1 | 32.24 | 39.95 | 27.43 | 0.28 | 0.02 | 0.03 | 0.03 | 0.01 | Stable |
| 2 | 19.15 | 39.55 | 40.73 | 0.31 | 0.03 | 0.17 | 0.04 | 0.02 | Slightly unstable |
| 3 | 20.53 | 50.11 | 29.11 | 0.07 | 0.01 | 0.14 | 0.01 | 0.02 | Stable |
| 4 | 13.61 | 49.81 | 36.17 | 0.22 | 0.05 | 0.08 | 0.03 | 0.03 | Stable |
| 5 | 22.55 | 66.05 | 11.19 | 0.10 | 0.03 | 0.04 | 0.03 | 0.01 | Stable |
| 6 | 32.20 | 39.91 | 27.40 | 0.26 | 0.02 | 0.15 | 0.05 | 0.01 | Stable |
| 7 | 19.17 | 39.59 | 40.77 | 0.28 | 0.04 | 0.12 | 0.02 | 0.02 | Stable |
| 8 | 10.44 | 65.51 | 23.79 | 0.14 | 0.04 | 0.03 | 0.04 | 0.01 | Stable |
| 9 | 21.21 | 55.75 | 22.56 | 0.23 | 0:01 | 0.19 | 0.03 | 0.02 | Stable |
| 10 | 32.20 | 39.90 | 27.40 | 0.33 | 0.02 | 0.13 | 0.01 | 0.01 | Slightly unstable |
| 11 | 19.12 | 39.48 | 40.66 | 0.52 | 0.03 | 0.14 | 0.04 | 0.02 | Slightly unstable |
| 12 | 20.51 | 50.05 | 29.08 | 0.16 | 0.07 | 0.10 | 0.03 | 0.01 | Slightly unstable |
| 13 | 13.59 | 49.74 | 36.12 | 0.24 | 0.01 | 0.28 | 0.01 | 0.02 | Slightly unstable |
| 14 | 22.49 | 65.88 | 11.16 | 0.30 | 0.03 | 0.06 | 0.07 | 0.01 | Slightly unstable |
| 15 | 32.20 | 39.91 | 27.40 | 0.28 | 0.02 | 0.13 | 0.02 | 0.04 | Slightly unstable |
| 16 | 19.22 | 39.69 | 40.87 | 0.10 | 0.04 | 0.03 | 0.03 | 0.02 | Stable |
| 17 | 10.42 | 65.37 | 23.74 | 0.25 | 0.01 | 0.17 | 0.04 | 0.01 | Stable |
| 18 | 21.11 | 55.48 | 22.45 | 0.66 | 0.03 | 0.18 | 0.03 | 0.06 | Slightly unstable |
| 19 | 19.13 | 39.51 | 40.69 | 0.27 | 0.04 | 0.22 | 0.08 | 0.07 | Slightly unstable |

From Table 21, it is apparent that the contents of all impurities of oxygen, hydrogen, chlorine, copper, and magnesium) in Nos. 1, 3–9, 16 and 17 satisfy the requirements of the present invention and discharge conditions were satisfactory. In contrast, in Experiments Nos. 2, 10 and 11, the following contents of impurities were out of the range defined as preferable in the present invention: oxygen content in Nos. 2, 10 and 11, hydrogen content in No. 12, chlorine content in No. 13, copper content in No. 14, magnesium content in NO. 15, oxygen and magnesium contents in No. 18, and chlorine, copper, and magnesium contents in No. 19. These results suggest that, for the purpose of attaining good discharge conditions during film-forming operation and of obtaining the hard wear resistant film of the present invention, which exhibits good and efficient discharge condition during film-forming operation, it is preferable to set the contents of the impurities (oxygen, hydrogen, chlorine, copper, and magnesium) in the targets within the range as defined in the present invention.

As described above, according to the present invention with the above arrangement, it is possible to obtain a hard film having higher wear resistance than the hard film for wear resistant applications such as cutting tools known in the past. This is accomplished by adding at least one element selected from Ti, N, W, Ta and Mo as Cr, V or M elements to TiAlN used in the past and by controlling the compositions of these components as defined in the present invention. By the realization of the hard film as given above, it is possible to supply cutting tools with longer service life suitable for the use in high-speed cutting operation or for cutting of steel of high hardness such as hardened steel.

The foregoing invention has been described in terms of preferred embodiments. However, those skilled, in the art will recognize that many variations of such embodiments exist. Such variations are intended to be within the scope of the present invention and the appended claims.

This application is based on patent application Nos. 2001-221773 and 2001-221772 filed in Japan, the contents of which are hereby incorporated by references.

What is claimed is:

1. A hard wear resistant film, comprising $(Al_b, [Cr_{1-\alpha} V_{\alpha}]_c) (C_{1-d}N_d)$, and the composition of the components satisfies the conditions:

$0.5 \leqq b \leqq 0.8$, $0.2 \leqq c \leqq 0.5$, $b+c=1$, $0.05 \leqq \alpha \leqq 0.95$, $0.5 \leqq d \leqq 1$ where b represents atomic ratio of Al, c represents atomic ratio of Cr+V, d represents atomic ratio of N, and α represents atomic ratio of V.

2. The hard wear resistant film according to claim 1, wherein the value of said "d" is 1.

3. The hard wear resistant film according to claim 1, wherein crystal structure has a rock salt structure as main structure.

4. The hard wear resistant film according to claim 1, wherein, when diffraction line intensities of (111) plane, (200) plane and (220) plane of rock salt structure determined by X-ray diffraction based on θ–2θ method are set to I(111), I(200) and I(220) respectively, these values satisfy the expression (1) and/or the expression (2) and the expression (3) as given below $$I(220) \leqq I(111) \quad (1)$$

$$I(220) \leqq I(200) \quad (2)$$

$$I(200)/I(111) \geqq 0.3 \quad (3).$$

5. A cutting tool which is coated with the hard wear resistant film defined in claim 1.

6. A method for manufacturing a hard wear resistant film as described in claim 1, wherein the method comprises the steps of evaporating and ionizing the metal in film forming gas atmosphere, and of forming film while promoting conversion of the film-forming gas together with the metal into plasma.

7. The method for manufacturing a hard wear resistant film according to claim 6, wherein, in an arc ion plating method for evaporating and ionizing the metals constituting the target by arc discharge, said method comprises the steps of forming a line of magnetic force running almost in parallel to the normal to the evaporating surface of the target and running in parallel to or slightly divergent from the normal to the evaporating surface of the target, and promoting conversion of the film-forming gas near an object to be processed by the line of magnetic force.

8. The method for manufacturing a hard wear resistant film according to claim 6, wherein bias potential applied on said object to be processed is set to the range of −50 V to −300 V with respect to the earth potential.

9. The method for manufacturing a hard wear resistant film according to claim 8, wherein temperature of said object to be processed during film-forming operation is set to the range of 300° C. to 800° C.

10. The method for manufacturing a hard wear resistant film according to claim 9, wherein partial pressure or total pressure of reactive gas during film forming operation is set to the range of 0.5 Pa to 6 Pa.

11. A hard wear resistant film, comprising $(M_a, Al_b, [Cr_{1-\alpha} V\alpha]_c) (C_{1-d}N_d)$, where M is at least one element selected from Ti, Nb, W, Ta and Mo, and satisfying the conditions:

$0.02 \leq a \leq 0.3$ $0.5 \leq b \leq 0.8$, $0.05 \leq c$, $a+b+c=1$, $0.5 \leq d \leq 1$, $0 \leq \alpha \leq 1$ where a represents atomic ratio of M, b represents atomic ratio of Al, c represents atomic ratio of Cr+V, d represents atomic ratio of N, and α represents atomic ratio of V; except when M is Ti, the value of α is not 0.

12. The hard wear resistant film according to claim 11, wherein said M is Ti.

13. The hard wear resistant film according to claim 12, wherein the values of said b and c satisfy the conditions:

$0.5 \leq b \leq 0.8$ $0.05 \leq c$, $0.7 \leq b+c$, and $\alpha=1$.

14. The hard wear resistant film according to claim 13, wherein the values of said "b+c" is 0.75 or more, and the value of said "a" is 0.25 or less.

15. The hard wear resistant film according to claim 11, wherein the value of said "d" is 1.

16. The hard wear resistant film according to claim 11, wherein crystal structure has a rock salt structure as main structure.

17. The hard wear resistant film according to claim 11, wherein, when diffraction line intensities of (111) plane, (200) plane and (220) plane of rock salt structure determined by X-ray diffraction based on 0–20 method are set to I(111), I(200) and I(220) respectively, these values satisfy the expression (1) and/or the expression (2) and the expression (3) as given below $$I(220) \leq I(111) \tag{1}$$

$$I(220) \leq I(200) \tag{2}$$

$$I(200)/I(111) \geq 0.3 \tag{3}.$$

18. A cutting tool which is coated with the hard wear resistant film defined in claim 11.

19. A method for manufacturing a hard wear resistant film as described in claim 11, wherein the method comprises the steps of evaporating and ionizing the metal in film forming gas atmosphere, and of forming film while promoting conversion of the film-forming gas together with the metal into plasma.

20. The method for manufacturing a hard wear resistant film according to claim 19, wherein, in an arc ion plating method for evaporating and ionizing the metals constituting the target by arc discharge, said method comprises the steps of forming a line of magnetic force running almost in parallel to the normal to the evaporating surface of the target and running in parallel to or slightly divergent from the normal to the evaporating surface of the target, and promoting conversion of the film-forming gas near an object to be processed by the line of magnetic force.

21. The method for manufacturing a hard wear resistant film according to claim 19, wherein bias potential applied on said object to be processed is set to the range of −50 V to −300 V with respect to the earth potential.

22. The method for manufacturing a hard wear resistant film according to claim 21, wherein temperature of said object to be processed during film-forming operation is set to the range of 300° C. to 800° C.

23. The method for manufacturing a hard wear resistant film according to claim 22, wherein partial pressure or total pressure of reactive gas during film forming operation is set to the range of 0.5 Pa to 6 Pa.

* * * * *

UNITED STATES PATENT AND TRADEMARK OFFICE

CERTIFICATE OF CORRECTION

PATENT NO. : 6,767,658 B2
DATED : July 27, 2004
INVENTOR(S) : Yamamoto et al.

It is certified that error appears in the above-identified patent and that said Letters Patent is hereby corrected as shown below:

Title page,
Item [73], Assignee should read:

-- [73] Assignee: Kabushiki Kaisha Kobe Seiko Sho (Kobe Steel, Ltd.), Kobe (JP) --

Signed and Sealed this

Twenty-first Day of September, 2004

JON W. DUDAS
*Director of the United States Patent and Trademark Office*